United States Patent
Srivastava et al.

(10) Patent No.: US 8,268,181 B2
(45) Date of Patent: Sep. 18, 2012

(54) PLASMA ASHING APPARATUS AND ENDPOINT DETECTION PROCESS

(75) Inventors: Aseem Kumar Srivastava, Germantown, MD (US); Palanikumaran Sakthivel, Gaithersburg, MD (US); Thomas James Buckley, Ijamsville, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 178 days.

(21) Appl. No.: 12/552,316

(22) Filed: Sep. 2, 2009

(65) Prior Publication Data
US 2010/0055807 A1 Mar. 4, 2010

Related U.S. Application Data

(62) Division of application No. 10/249,964, filed on May 22, 2003.

(51) Int. Cl.
G01L 21/30 (2006.01)
G01R 31/00 (2006.01)

(52) U.S. Cl. .......................... 216/60; 438/710; 438/725

(58) Field of Classification Search ............ 216/60; 438/710, 725
See application file for complete search history.

(56) References Cited

U.S. PATENT DOCUMENTS

| | | | |
|---|---|---|---|
| 4,341,592 A | 7/1982 | Shortes et al. | |
| 4,773,355 A | 9/1988 | Reif et al. | |
| 4,792,378 A | 12/1988 | Rose et al. | |
| 5,356,673 A | 10/1994 | Schmitt et al. | |
| 5,366,557 A | 11/1994 | Yu | |
| 5,498,308 A | 3/1996 | Kamarehi et al. | |
| 5,552,017 A | 9/1996 | Jang et al. | |
| 5,614,026 A | 3/1997 | Williams | |
| 5,844,195 A | 12/1998 | Fairbairn et al. | |
| 5,928,426 A | 7/1999 | Aitchison | |
| 5,961,851 A | 10/1999 | Kamarchi et al. | |
| 5,965,034 A | 10/1999 | Vinogradov et al. | |

(Continued)

FOREIGN PATENT DOCUMENTS

EP 1150331 4/2001

(Continued)

OTHER PUBLICATIONS

Office Action—Non-Final for U.S. Appl. No. 10/249,964, filed May 22, 2003; Mail Date: Aug. 18, 2010.

(Continued)

Primary Examiner — Roberts Culbert
(74) Attorney, Agent, or Firm — Cantor Colburn LLP

(57) ABSTRACT

A plasma ashing apparatus for removing organic matter from a substrate including a low k dielectric, comprising a first gas source; a plasma generating component in fluid communication with the first gas source; a process chamber in fluid communication with the plasma generating component; an exhaust conduit in fluid communication with the process chamber; wherein the exhaust conduit comprises an inlet for a second gas source and an afterburner assembly coupled to the exhaust conduit, wherein the inlet is disposed intermediate to the process chamber and an afterburner assembly, and wherein the afterburner assembly comprises means for generating a plasma within the exhaust conduit with or without introduction of a gas from the second gas source; and an optical emission spectroscopy device coupled to the exhaust conduit comprising collection optics focused within a plasma discharge region of the afterburner assembly. An endpoint detection process for an oxygen free and nitrogen free plasma process comprises monitoring an optical emission signal of an afterburner excited species in an exhaust conduit of the plasma asher apparatus. The process and apparatus can be used with carbon and/or hydrogen containing low k dielectric materials.

17 Claims, 14 Drawing Sheets

U.S. PATENT DOCUMENTS

| | | | |
|---|---|---|---|
| 5,968,275 | A | 10/1999 | Lee et al. |
| 5,986,747 | A | 11/1999 | Moran |
| 5,994,678 | A | 11/1999 | Zhao et al. |
| 6,010,748 | A | 1/2000 | Van Buskirk et al. |
| 6,045,618 | A | 4/2000 | Raoux et al. |
| 6,082,374 | A | 7/2000 | Huffman et al. |
| 6,090,210 | A | 7/2000 | Ballance et al. |
| 6,106,625 | A | 8/2000 | Koai et al. |
| 6,190,507 | B1 | 2/2001 | Whealton et al. |
| 6,190,732 | B1 | 2/2001 | Omstead et al. |
| 6,193,802 | B1 | 2/2001 | Pang et al. |
| 6,194,628 | B1 | 2/2001 | Pang et al. |
| 6,255,222 | B1 | 7/2001 | Xia et al. |
| 6,259,072 | B1 | 7/2001 | Kinnard et al. |
| 6,281,135 | B1 | 8/2001 | Han et al. |
| 6,352,050 | B2 | 3/2002 | Kamarehi et al. |
| 6,367,412 | B1 | 4/2002 | Ramaswamy et al. |
| 6,368,567 | B2 | 4/2002 | Comita et al. |
| 6,391,146 | B1 | 5/2002 | Bhatnagar et al. |
| 6,415,736 | B1 | 7/2002 | Hao et al. |
| 6,422,002 | B1 | 7/2002 | Whealton et al. |
| 6,444,039 | B1 | 9/2002 | Nguyen |
| 6,471,822 | B1 | 10/2002 | Yin et al. |
| 6,492,186 | B1 | 12/2002 | Han et al. |
| 6,503,330 | B1 | 1/2003 | Sneh et al. |
| 6,537,419 | B1 | 3/2003 | Kinnard |
| 6,538,734 | B2 | 3/2003 | Powell |
| 6,548,416 | B2 | 4/2003 | Han et al. |
| 6,565,661 | B1 | 5/2003 | Nguyen |
| 6,592,817 | B1 | 7/2003 | Tsai et al. |
| 6,599,367 | B1 | 7/2003 | Nakatsuka |
| 6,633,391 | B1 | 10/2003 | Oluseyi et al. |
| 6,635,117 | B1 | 10/2003 | Kinnard et al. |
| 6,692,649 | B2 | 2/2004 | Collison et al. |
| 6,761,796 | B2 | 7/2004 | Srivastava et al. |
| 6,782,843 | B2 | 8/2004 | Kinnard et al. |
| 6,783,627 | B1 | 8/2004 | Mahawili |
| 2001/0016674 | A1 | 8/2001 | Pang et al. |
| 2002/0066535 | A1 | 6/2002 | Brown et al. |
| 2002/0088542 | A1 | 7/2002 | Nishikawa et al. |
| 2002/0144706 | A1 | 10/2002 | Davis et al. |
| 2002/0144785 | A1 | 10/2002 | Srivastava et al. |
| 2003/0012624 | A1 | 1/2003 | Kinnard et al. |
| 2003/0032300 | A1 | 2/2003 | Waldfried et al. |
| 2003/0094134 | A1 | 5/2003 | Minami |
| 2003/0205328 | A1 | 11/2003 | Kinnard et al. |
| 2004/0026305 | A1 | 2/2004 | Hohmann et al. |
| 2004/0129211 | A1 | 7/2004 | Blonigan et al. |
| 2004/0144489 | A1 | 7/2004 | Satoh et al. |
| 2004/0149223 | A1 | 8/2004 | Collison et al. |
| 2004/0235299 | A1 | 11/2004 | Srivastava et al. |
| 2004/0238123 | A1 | 12/2004 | Becknell et al. |

FOREIGN PATENT DOCUMENTS

| | | |
|---|---|---|
| JP | 62294180 | 12/1987 |
| WO | 9737055 | 10/1997 |
| WO | 0020655 | 4/2000 |

OTHER PUBLICATIONS

Mono Torr(R) "High Flow Heated Getter Gas Purifier", (c)2001 SAES Pure Gas, Inc., L130-007—Revision A, www.saesgetters.com.

Webster's II New Riverside University Dictionary, "flange", p. 484, 1994.

PLASMA ASHING APPARATUS AND ENDPOINT DETECTION PROCESS

CROSS REFERENCE TO RELATED APPLICATIONS

This application is a divisional of the legally related U.S. Non-Provisional application Ser. No. 10/249,964, filed May 22, 2003, which is fully incorporated herein by reference.

BACKGROUND

The present disclosure relates to semiconductor apparatuses and processes, and more particularly, to plasma mediated processes and plasma apparatuses suitable for ashing organic material from a substrate including a low k dielectric material.

Recently, much attention has been focused on developing low k dielectric thin films for use in the next generation of microelectronics. As integrated devices become smaller, the RC-delay time of signal propagation along interconnects becomes one of the dominant factors limiting overall chip speed. With the advent of copper technology, R has been pushed to its practical lowest limit for current state of the art so attention must be focused on reducing C. One way of accomplishing this task is to reduce the average dielectric constant (k) of the thin insulating films surrounding interconnects. The dielectric constant (k) of traditional silicon dioxide insulative materials is about 3.9. Lowering the dielectric constant (k) below 3.9 will provide a reduced capacitance.

Low k dielectric materials used in advanced integrated circuits typically comprise organic polymers or oxides and have dielectric constants less than about 3.5. The low k dielectric materials can be spun onto the substrate as a solution or deposited by a chemical vapor deposition process. Important low k film properties include thickness and uniformity, dielectric constant, refractive index, adhesion, chemical resistance, thermal stability, pore size and distribution, coefficient of thermal expansion, glass transition temperature, film stress, and copper diffusion coefficient.

In fabricating integrated circuits on wafers, the wafers are generally subjected to many process steps before finished integrated circuits can be produced. Low k dielectric materials, especially carbon containing low k dielectric materials, can be sensitive to some of these process steps. For example, plasma used during an "ashing" step can strip both photoresist materials as well as remove a portion of the low-k dielectric film. Ashing refers to a plasma mediated stripping process by which photoresist and post etch residues are stripped or removed from a substrate upon exposure to the plasma. The ashing process generally occurs after an etching or implant process has been performed in which a photoresist material is used as a mask for etching a pattern into the underlying substrate or for selectively implanting ions into the exposed areas of the substrate. The remaining photoresist and any post etch or post implant residues on the wafer after the etch process or implant process is complete must be removed prior to further processing for numerous reasons generally known to those skilled in the art. The ashing step is typically followed by a wet chemical treatment to remove traces of the residue, which can cause further degradation of the low k dielectric, loss of material, and may also cause increase in the dielectric constant.

It is important to note that ashing processes significantly differ from etching processes. Although both processes may be plasma mediated, an etching process is markedly different in that the plasma chemistry is chosen to permanently transfer an image into the substrate by removing portions of the substrate surface through openings in a photoresist mask. The plasma generally includes high-energy ion bombardment at low temperatures and low pressures (on the order of milli-Torrs) to remove portions of the substrate. Moreover, the portions of the substrate exposed to the ions are generally removed at a rate equal to or greater than the removal rate of the photoresist mask. In contrast, ashing processes generally refer to selectively removing the photoresist mask and any polymers or residues formed during etching. The ashing plasma chemistry is much less aggressive than etching chemistries and is generally chosen to remove the photoresist mask layer at a rate much greater than the removal rate of the underlying substrate. Moreover, most ashing processes heat the substrate to temperatures greater than 200° C. to increase the plasma reactivity, and are performed at pressures of about 1.0 Torr. Thus, etching and ashing processes are directed to removal of significantly different materials and as such, require completely different plasma chemistries and processes. Successful ashing processes are not used to permanently transfer an image into the substrate. Rather, successful ashing processes are defined by the photoresist, polymer and residue removal rates without affecting or removing underlying layers, e.g., low k dielectric layers.

Studies have suggested that a significant contribution to low k dielectric degradation during photoresist removal processes results from the use of, oxygen and/or nitrogen and/or fluorine containing gas sources typically used for ashing. Although gas mixtures containing one or more of these sources efficiently ash photoresist from the substrate, the use of these gas sources has proven detrimental to substrates containing low k dielectrics. For example, oxygen-containing plasma discharges are known to raise the dielectric constant of low k dielectric underlayers during plasma processing. The increases in dielectric constant affects, among others, interconnect capacitance, which directly impacts device performance. Moreover, the use of oxygen-containing plasma discharges is generally less preferred for advanced device fabrication employing copper metal layers since copper metal is readily oxidized at the elevated temperatures typically employed for photoresist ashing. Occasionally, the damage is not detected during metrology inspection of the substrate after plasma processing. However, the damage can be readily demonstrated by a subsequent wet cleaning process, as may be typically employed after plasma ashing, wherein portions of the carbon and/or hydrogen-containing low k dielectric material are removed. The removed portions of the dielectric material are a source of variation in the critical dimension (CD) of the feature that is frequently unacceptable and impacts overall device yield. Moreover, even if a wet clean process is not included, the electrical and mechanical properties of the dielectric material may be changed by exposure to the oxygen-free plasma discharges thereby affecting operating performance. It is believed that carbon is depleted from the dielectric material during the plasma exposure.

Ideally, the ashing plasma should not affect the underlying low k dielectric layers and preferably removes only the photoresist material. The use of $SiO_2$ as the dielectric material provided high selectivity with these gas sources. In order to minimize damage to the low k dielectric, oxygen and nitrogen free plasma processes have been developed. One such process includes generating plasma from a gas mixture comprising helium and hydrogen. However, the mechanism of removal is different for these less aggressive plasma discharges. The oxygen and nitrogen free plasma such as the plasma formed from helium and hydrogen does not ash the photoresist in the traditional sense. Rather, it is believed that the plasma causes portions of the photoresist to sublime from the substrate. As a result of the mechanism of removal, while effective for removing photoresist material from the substrate, the plasma exposure tends to deposit large bodies of the sublimed photoresist and byproducts within the processing chamber and in areas downstream from the plasma process chamber such as in the throttle valve and exhaust lines. The buildup of these ashing materials can lead to short mean-time-between-clean (MTBC) times and frequent rebuild/replacement of vacuum hardware resulting in loss of throughput and increased costs of ownership. Additionally, deposits of photoresist material within the process chamber that are located above the plane of the substrate can lead to particulate contamination on the substrate, thereby further affecting device yields.

An additional problem with oxygen free and nitrogen free plasma discharges is the non-uniformity of the plasma exposure. Since these plasma discharges are less aggressive, non-uniformity is a significant issue. Some downstream plasma ashers have a narrow diameter orifice plasma tube in which the plasma is generated. The diameter of the substrate is generally much larger than the diameter of the plasma tube orifice. As such, baffle plates are typically positioned near the plasma tube outlet to deflect the plasma as it enters the process chamber such that the plasma species in the plasma are uniformly dispersed across the substrate. However, it has been found that the less aggressive plasma discharges have fewer reactive species and the dispersal from the center point of the baffle plate to its outer edge can result in hot spots on the wafer, i.e., areas of non-uniformity. For example, it has been speculated that hydrogen radicals generated within a plasma recombine as the hydrogen species travel from the center most impingement point on the baffle plate in the axial flow reactor to the outer edges of the baffle plate, thereby leading to lower ashing rates at the edge of the wafer. In chamber designs where the diameter of the wafer is comparable to that of the plasma tube, non-uniformity of radicals can be mitigated in other ways.

Another problem with oxygen free and nitrogen free plasmas concerns endpoint detection. Traditional endpoint detection methods and apparatus are not suitable for muse with these types of plasma discharges. For example, as in the case of plasma formed from a hydrogen and helium gas mixture, no optically excited species are created at the wafer plane that generate a signal suitable for endpoint detection.

Accordingly, there remains a need for improved processes and apparatuses for generating oxygen and nitrogen free plasma discharges for use with low k dielectrics.

BRIEF SUMMARY

Disclosed herein is a plasma ashing apparatus for removing photoresist and/or post etch residues from a substrate, comprising a first gas source; a plasma generating component in fluid communication with the first gas source, wherein the plasma generating component generates a first plasma for selectively removing the photoresist and/or post etch residues from the substrate; a process chamber in fluid communication with the plasma generating component for receiving the plasma, wherein the process chamber contains the substrate; an exhaust conduit in fluid communication with the process chamber; wherein the exhaust conduit comprises a port for introducing a second gas source and an afterburner assembly coupled to the exhaust conduit, wherein the port is disposed intermediate to the process chamber and the afterburner assembly; and an optical detection system coupled to the exhaust conduit comprising collection optics focused within a plasma discharge region of the afterburner assembly.

In another embodiment, a downstream plasma ashing and/or residue removal apparatus comprises means for generating a plasma in an exhaust conduit in fluid communication with a process chamber; means for monitoring an emission signal for species generated within the plasma; and means for determining an endpoint of a plasma ashing and/or residue removal process on a substrate in the process chamber from the emission signal produced in the exhaust conduit.

A method for detecting an endpoint for an oxygen free and nitrogen free plasma ashing process, comprising exposing a substrate comprising photoresist material and/or post etch residues thereon to the oxygen free and nitrogen free plasma in a process chamber; removing the photoresist material and/or post etch residues from the substrate; exhausting the removed photoresist material and/or post etch residues from the process chamber into an exhaust conduit fluidly coupled to the process chamber; selectively introducing an oxidizing gas into the exhaust conduit; generating an oxygen containing plasma from the oxidizing gas and the exhausted photoresist material and/or post etch residues to form emissive species; and optically monitoring an emission signal produced by the emissive species to determine the endpoint of the oxygen free and nitrogen free plasma ashing.

In another embodiment, an endpoint detection process for an oxygen free and nitrogen free plasma ashing process for removing photoresist and/or residues from a substrate, comprising introducing an oxidizing gas and a plasma ashing discharge into an exhaust conduit of a plasma asher apparatus, wherein the plasma ashing discharge comprises photoresist material, post etch residues, and post ashing products, and wherein the plasma ashing discharge is free from atomic nitrogen and atomic oxygen species; generating a plasma from the oxidizing gas and the plasma ashing discharge to form emissive species; and optically monitoring an emission signal intensity correlating to the emissive species, wherein an endpoint of the oxygen free and nitrogen free plasma ashing process is detected when the emission signal intensity correlating to the emissive species is no longer present.

In another embodiment, a method for determining an endpoint of an oxygen fee and nitrogen free plasma ashing process used for stripping photoresist material from a substrate having a carbon containing low k dielectric material, comprising exposing the substrate to the oxygen free and nitrogen free plasma ashing process in a process chamber to remove the photoresist material from the substrate and form volatile byproducts; exhausting the photoresist material and volatile byproducts from the process chamber into an exhaust conduit; selectively introducing an oxidizing gas into the exhaust conduit, wherein the oxidizing gas does not flow into the process chamber; generating a plasma in the exhaust conduit from oxidizing gas, the exhausted photoresist material, and the volatile byproducts; measuring an emission signal intensity in the exhaust conduit correlating to a wavelength of about 283 nm, 309 nm, about 387 nm, about 431 nm, about 434 nm, about 468 nm, about 472 nm, about 513 nm, about 516 nm, about 656 nm, about 777 nm, about 845 nm or a combination of at least one of the foregoing wavelengths; and determining the endpoint of the oxygen free and nitrogen free plasma ashing process in response to an observed change in the emission signal within the exhaust conduit.

In yet another embodiment, a method for determining an endpoint of an oxygen fee and nitrogen free plasma ashing process used for stripping photoresist material from a substrate having a carbon containing low k dielectric material, comprising generating a first plasma in a process chamber in the absence of oxygen and nitrogen from a gas mixture comprising hydrogen or helium or a combination comprising at least one of the foregoing gases; exposing the substrate provided in the process chamber to the first plasma to selectively remove photoresist material and/or residues from the substrate; exhausting the removed photoresist material and/or residues from the process chamber into an exhaust conduit; generating a second plasma in the exhaust conduit to generate emissive species; and optically monitoring the emissive species, wherein an endpoint of the first plasma is detected when an intensity of the emissive species changes.

The above described and other features are exemplified by the following figures and detailed description.

BRIEF DESCRIPTION OF THE DRAWINGS

Referring to the exemplary drawings wherein like elements are numbered alike in the several Figures.

DETAILED DESCRIPTION OF THE PREFERRED EMBODIMENTS

Figure 1:
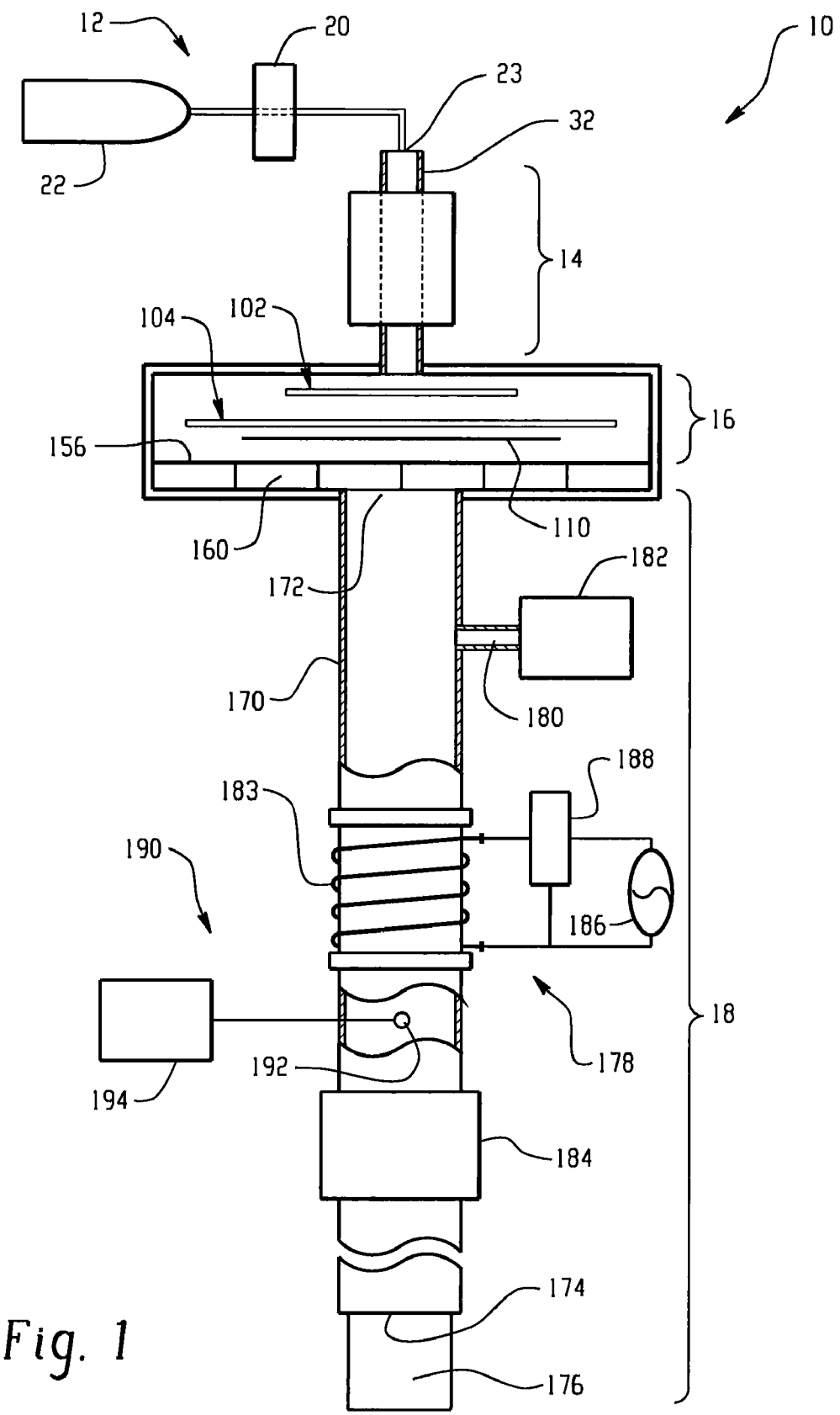
FIG. 1 is a cross sectional view of a downstream plasma ashing apparatus.

FIG. 1 generally illustrates an axial flow downstream plasma apparatus 10 suitable for use in removing photoresist, sidewall deposits, and post etch residues from substrates including low k dielectric materials. The plasma apparatus 10 generally comprises a gas delivery component 12, a plasma-generating component 14, a processing chamber 16, and an exhaust assembly component 18. The various components, in combination, provide improvements in processing substrates with oxygen free and nitrogen free plasma discharges, wherein the substrates include carbon containing low k dielectric materials.

Downstream axial flow plasma apparatuses particularly suitable for modification in the present disclosure are plasma ashers, such as for example, those microwave plasma ashers available under the trade name Fusion ES3LK and commercially available from Axcelis Technologies Corporation. Portions of the microwave plasma asher are described in U.S. Pat. Nos. 5,498,308 and 4,341,592, and PCT International Application No. WO/97/37055, herein incorporated by reference in their entireties. As will be discussed below, the disclosure is not limited to any particular plasma asher in this or in the following embodiments. For instance, an inductively or capacitively coupled plasma reactor can be used.

Carbon-containing low k dielectrics are hereinafter defined as those carbon containing insulating materials suitable for use in the manufacture of integrated circuits or the like having a dielectric constant less than about 3.5, with a dielectric constant less than about 3.0 more preferred. The carbon-containing low k dielectric materials may include pendant groups that contain carbon or may be carbon-containing wherein the backbone of the dielectric material is primarily comprised of an interconnecting network of carbon. Carbon-containing low k dielectrics can generally be categorized as one of two types: organic and doped oxides. Examples of organic low k dielectric materials include polyimides, benzocyclobutene, parylenes, diamond-like carbon, poly(arylene ethers), cyclotenes, fluorocarbons and the like, such as those dielectrics commercially available under the trademarks SiLK, or BCB. Examples of doped oxide low k dielectric materials include methyl silsesquioxane, hydrogen silsesquioxanes, nanoporous oxides, carbon doped silicon dioxides, and the like, such as, for example, those dielectrics commercially available under the trademarks CORAL, BLACK DIAMOND and AURORA. Both types of carbon-containing low-k materials exist in dense and porous versions. Porous versions thereof are commercially known under trademarks such as LKD, ORION, BOSS, or porous SiLK. Other carbon-containing low k dielectric materials will be apparent to one of ordinary skill in the art in view of this disclosure.

Likewise, hydrogen containing low k dielectrics are hereinafter defined as those hydrogen containing insulating materials suitable for use in the manufacture of integrated circuits or the like having a dielectric constant less than about 3.5. Many of the carbon containing low k dielectrics described above include one or more hydrogen atoms attached to the carbon atoms within its chemical structure. However, suitable hydrogen containing low k dielectric materials in the present disclosure are not intended to be limited to carbon containing structures.

As shown in FIG. 1, the gas delivery component 12 preferably comprises a gas purifier 20 in fluid communication with a gas source 22 (for generating the oxygen free and nitrogen free plasma) and a gas inlet 24 of the plasma-generating component 14. An additional gas source (not shown) may be in fluid communication with the gas inlet 24 for providing in situ cleaning capabilities. In situ cleaning is a process for cleaning the process chamber 16 using the plasma source as opposed to manually cleaning the chamber components by disassembling a portion of the process chamber for access thereto. In a preferred embodiment, the purifier 20 is adapted to reduce the level of impurities to less than about 10 parts per million (ppm), with impurity levels less than about 5 ppm more preferred, with impurity levels less than about 1 ppm more preferred, and with less than about 100 parts per billion (ppb) most preferred. Suitable purifiers achieving these impurity levels include those based on a metal gettering technology such as those gas purifiers commercially available under the trade name MONO TORR®. high flow purifiers from SAES Pure Gas, Inc. The use of the gas purifier 20 in fluid communication with the gas source 22 employed for forming the plasma reduces the level of contaminants to amounts effective for robust processing of low k dielectric substrates, and in particular, carbon-containing low k dielectrics. Suitable gases for generating the oxygen free and nitrogen free plasma include, but are not intended to be limited to, hydrogen, helium, argon, neon, other inert gases, hydrocarbons, and combinations comprising one or more of the foregoing gases. For example, a helium gas source having a reported purity of 99.999% can be undesirable for plasma mediated processing of carbon-containing low k dielectrics. Impurities such as $H_2O$, $O_2$, CO, $CO_2$, and $N_2$, can be at levels sufficient to cause erosion of the low k dielectric during further processing of the substrate and/or deleteriously cause an increase in the dielectric constant. Preferably, the incoming gas for forming the plasma is purified to contain less than 100 ppb of $H_2O$, $O_2$, CO, $CO_2$, and $N_2$. The purifier 20 is preferably selected to be efficient and provide these preferred impurity levels at relatively high flow rates, e.g., flow rates of about 100 to about 12,000 standard cubic centimeters per minute (sccm) or more can be expected for a 3.00 mm downstream plasma asher.

Figure 2:
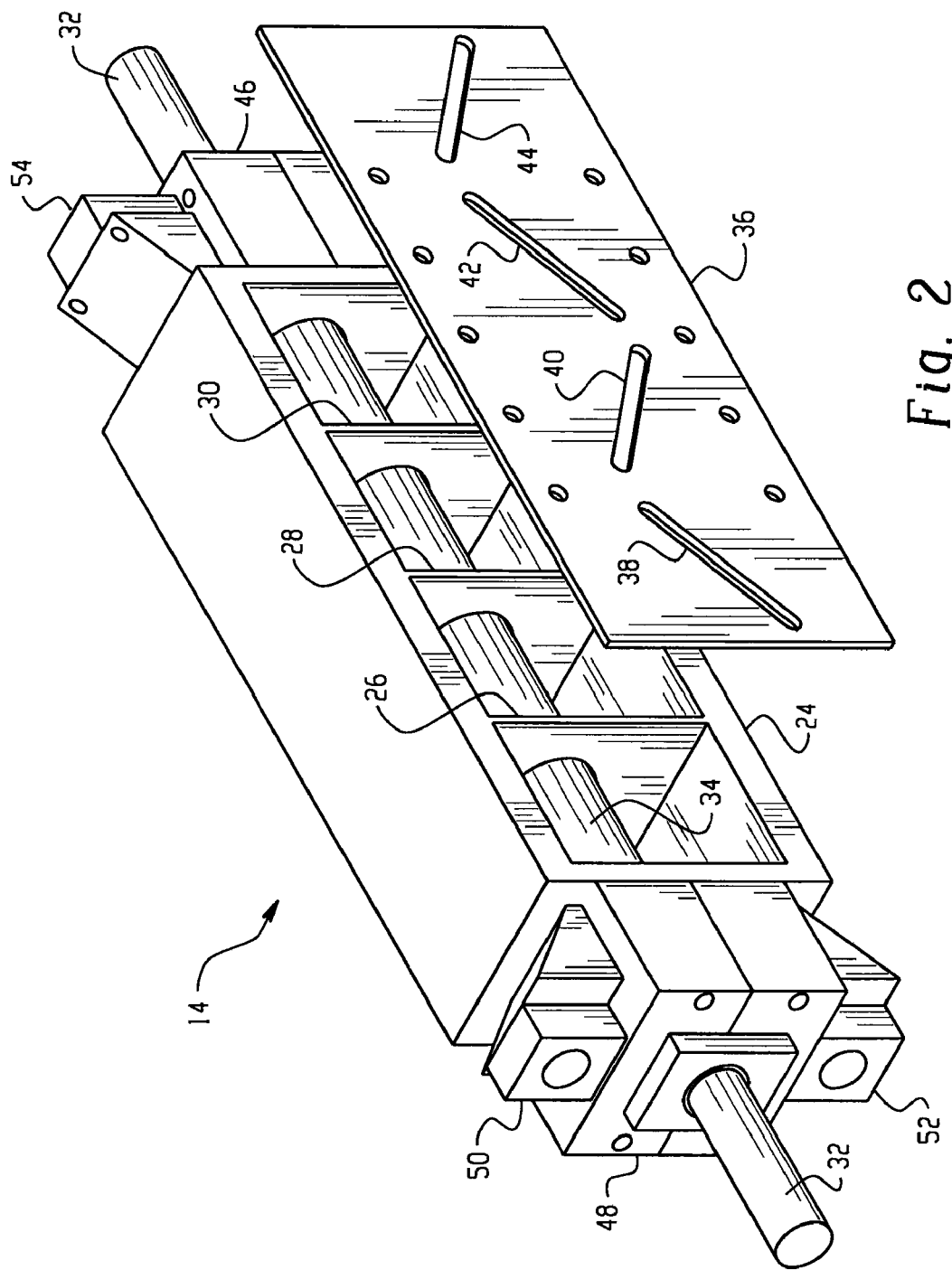
FIG. 2 shows a perspective view of a microwave enclosure for use in a plasma asher apparatus.
Figure 3:
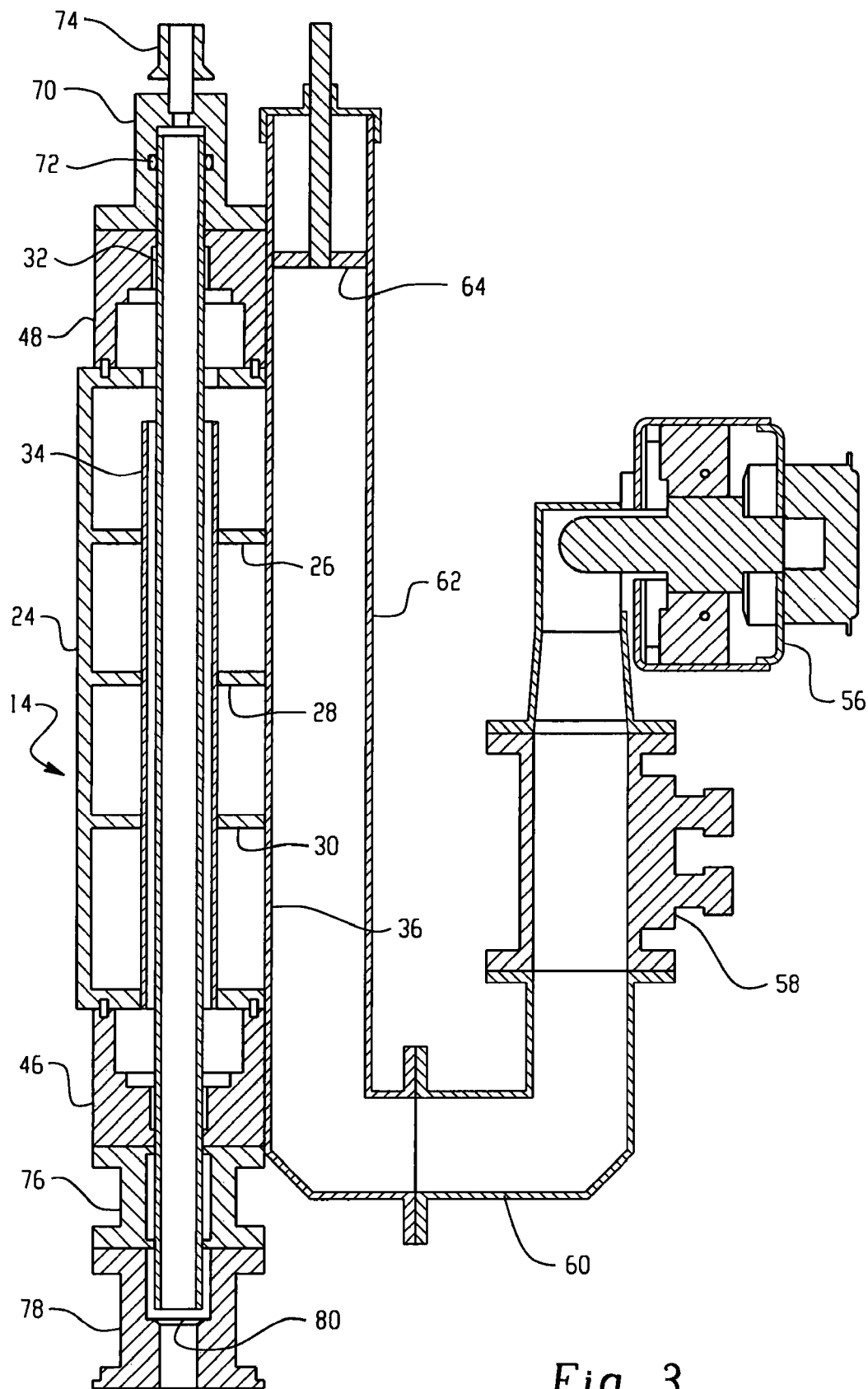
FIG. 3 shows a cross sectional view which schematically shows a plasma generating component suitable for use with the downstream plasma ashing apparatus.
Figure 4:
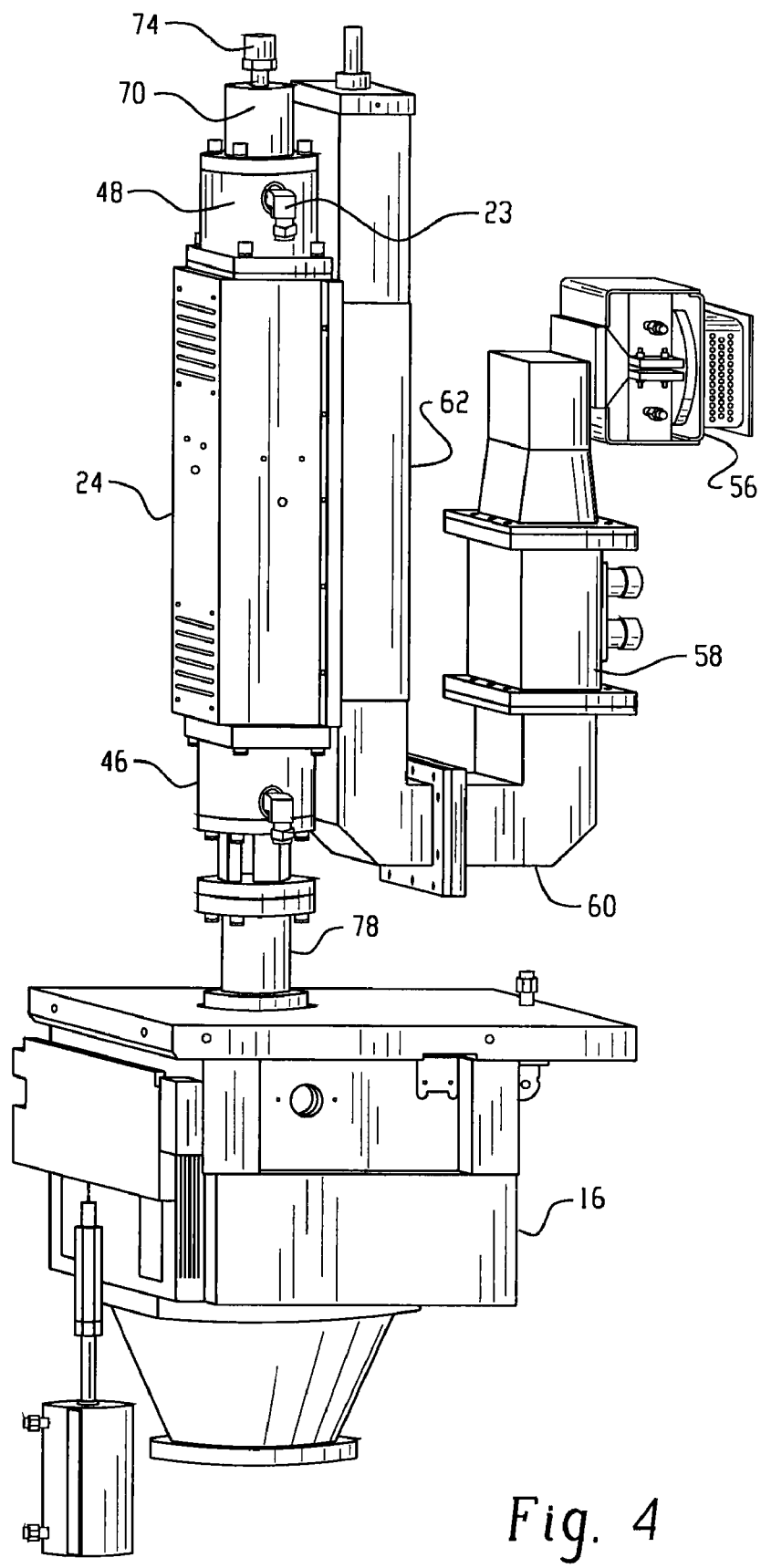
FIG. 4 shows perspective view of the plasma ashing apparatus.

FIGS. 2 and 3 illustrate an exemplary microwave plasma-generating component 14 with which the present disclosure may be practiced. FIG. 4 illustrates a perspective view of the plasma ashing apparatus 10 including the microwave plasma-generating component and a perspective view of the process chamber 16. It is to be understood that the plasma-generating component 14 has been simplified to illustrate only those components that are relevant to an understanding of the present disclosure. Those of ordinary skill in the art will recognize that other components may be required to produce an operational plasma ashing apparatus 10. However, because such components are well known in the art, and because they do not further aid in the understanding of the present disclosure, a discussion of such components is not provided.

The microwave plasma-generating component 14 includes a microwave enclosure 24. The microwave enclosure 24 is a rectangular box that is partitioned using lengthwise sections 26, 28, and 30 having plasma tube 32 passing therethrough. Each partition has an opening through which the plasma tube passes. Each section is fed with microwave energy during operation. Thus, each section appears to be a relatively short cavity to the incoming microwave energy, promoting the formation of modes having azithumal and axial uniformity. Outer tube 34 surrounds the plasma tube inside the cavity. The outer tube is slightly separated from the plasma tube and air, under positive pressure, is fed between the two tubes to provide effective cooling of the plasma tube. Tube 32 is preferably made of sapphire. Other plasma tube materials such as quartz or alumina-coated quartz or other ceramic materials can be used. Preferably, the microwave enclosure 24 is dimensioned to support the rectangular TM 110 mode and the enclosure 24 may have a square cross section. The dimensions of the cross sections are such that the TM 110 mode is resonant. The length of each section is less than $\lambda g/2$ where $\lambda g$ is the guide length within the cavity of the TE 104 mode.

The openings in the partitions 26, 28, and 30 through which the concentric tubes are fed are made larger than the exterior dimension of the plasma tube. Also shown is an iris plate 36, which covers the open side of the microwave structure and is effective to feed microwave energy into adjacent sections. Plate 36 is a flat metallic plate having irises 38, 40, 42, 44, through which the microwave energy is fed. There is microwave transmission through these irises, which causes plasma to be excited in the part of the tube that is surrounded by the partition. Such transmission helps reduce thermal gradients in the plasma tube between regions surrounded by partitions and regions that are not. If an outer tube is not used (cooling provided in some other manner) the openings in the partition are sized so that there is a space between the plasma tube and the partition to provide such microwave transmission.

Microwave traps 46 and 48 are provided at the ends to prevent microwave transmission. Such traps may be of the type disclosed in U.S. Pat. No. 5,498,308. Air seals/directional feeders 50 and 52 are provided for admitting cooling air and feeding it to the space between the concentric tubes. Air seals/directional feeder 54 are shown at the outlet end and a fourth such unit is present but is not seen.

Magnetron 56 provides microwave power that is fed through coupler 58 to a waveguide supplying TE 10 mode, having mutually perpendicular sections 60 and 62. The length of waveguide section 62 is adjustable with moveable plunger 64. The bottom plate of waveguide section 62 is iris plate 36, which couples microwave energy into partitioned microwave structure 24, through which the plasma tube 32 extends; thus plasma is excited in the gas mixture flowing through the plasma tube.

Referring again to FIG. 3, it is seen that end cap 70 abuts microwave trap 48, and fitting 74 having a central orifice for admitting gas to the plasma tube extends into the end cap. The gas supply 22 is regulated by an external flow box (not shown). The gas purifier 20 is disposed in fluid communication with the gas supply 22 and the gas inlet 23 (see FIG. 1). The plasma tube 32 is supported at this end by "o" ring 72 in the end cap. The outer tube 34 is supported at its ends by abutment against microwave traps 46 and 48. Spacer 76 is present to provide the proper spacing in relation to the process chamber. The other end of the plasma tube is located in end member 78, and has an opening 80 for emitting plasma/gas into the process chamber 16. Optionally, the conduit forming the opening 80 is fitted with a narrow aperture fitting to create a pressure differential between the plasma tube 32 and the processing chamber 16, wherein the pressure is greater in the plasma tube 32. During operation, the pressure within the plasma tube 32 preferably ranges from about 1 torr to about atmospheric pressure. In contrast, the pressure within the process chamber during operation ranges from about 100 millitorr to about atmospheric pressure.

The opening 80 of the plasma tube 32 is in fluid communication with an interior region of the process chamber 16. Since the plasma is discharged from a relatively narrow orifice (compared to the dimensions of the substrate to be processed) into the interior of the process chamber, a gas distribution system 100 to promote uniform plasma exposure onto the substrate is disposed within the process chamber 16. The gas distribution system 100 is disposed intermediate to the substrate and opening 80 of the plasma tube 32.

In a preferred embodiment, the gas distribution system 100 comprises one or more baffle plates above the wafer to promote even distribution of the plasma to the substrate surface. The baffle plates preferably include multiply stacked baffle plates, wherein each plate contains one or more apertures. A plenum is formed between the baffle plate assembly and the upper wall of the process chamber. In an especially preferred embodiment, the baffle plate assembly is adapted to provide more uniform concentration of reactive species from the plasma to the wafer surface. As discussed in the background section, it has been discovered that hydrogen radicals, for example, created within a plasma decrease in concentration due to recombination as the hydrogen radicals travel from the center most impingement point in the axial flow reactor to the outer edges of the baffle plate. While not wanting to be bound by theory, it is believed that the reduction in activity of hydrogen radicals as these species flow to the outer edges of the baffle plate may be due to shorter lifetimes of hydrogen atoms than can be supported by the radial distance these species have to travel from the center-fed axial plasma flow to the outer edges of the plenum. Once the hydrogen radicals have recombined into molecular hydrogen or the like, the neutral gas can no longer react with the photoresist. Another reason may be that in an axial flow reactor design such as the downstream plasma asher described herein, the photoresist ashing byproducts and spent gas from the central portions of the wafer must flow past the edge of the wafer in order to reach the exhaust conduit 170 of the process chamber 16. This results in significant dilution of the active hydrogen radicals nearer the edge of the wafer compared to the more central portions and additionally provides for the radicals closer to the edge to deactivate by reacting with the photoresist ashing byproducts that have been removed from the central locations. It has been discovered that increased uniformity of ashing can be achieved distally from the centerpoint of the baffle plate to the outer edges by increasing the aperture density of the baffle plate. For example, by increasing the aperture density from the centerpoint to the outer edges or by increasing the size of the apertures from the centerpoint of the baffle plate to the outer edges, or by including an apertureless centerpoint, or by a combination of one or more of the foregoing baffle plate configurations can increase reactivity and improve plasma uniformity at the substrate.

Figure 5:
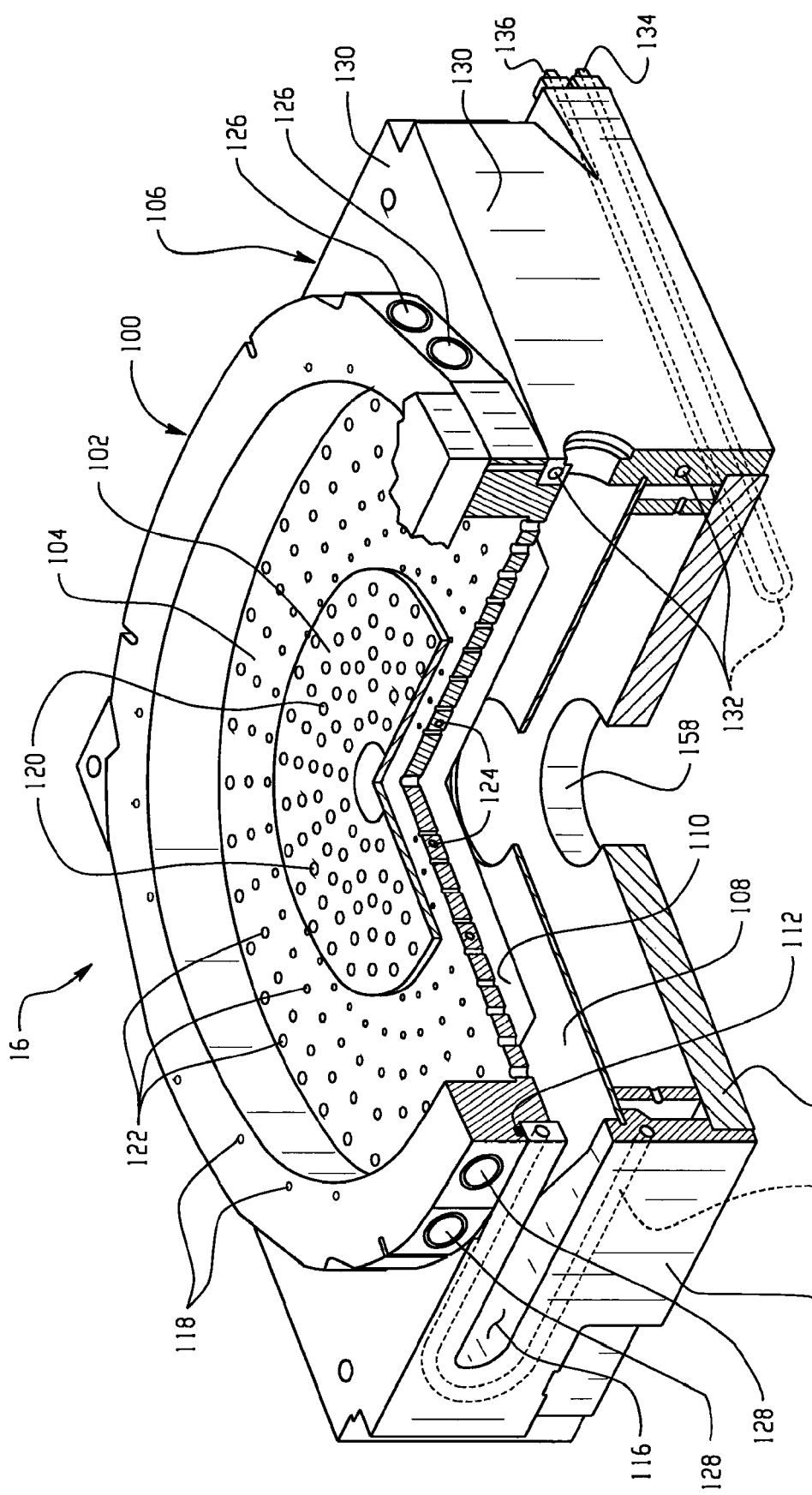
FIG. 5 is a partial cutaway perspective view of a photoresist asher process chamber into which is installed a gas distribution system.

FIGS. 5-8 illustrate suitable gas distribution systems for use in the apparatus 10. In a preferred embodiment, the gas distribution system 100 is a dual baffle plate assembly. FIG. 5 shows the process chamber 16 into which is incorporated a first embodiment of the gas distribution system or baffle plate assembly 100. The asher process chamber 16 having the baffle plate assembly 100 installed therein is suitable for use in a 300 millimeter (mm) wafer processing system. The gas distribution system 100 could also be adapted for use with 200 mm wafers, as would be appreciated by one of ordinary skill in the art in view of this disclosure. Although the present disclosure is shown as being implemented within a downstream plasma asher apparatus, it may also be used in other semiconductor manufacturing equipment, such as residue removal, stripping, and isotropic etching equipment.

The baffle plate assembly 100 comprises an upper apertured baffle plate 102 and a relatively larger lower apertured baffle plate 104 positioned generally parallel to each other and separated from one another. The baffle plate assembly 100 is attached to a lower portion 106 of the process chamber that includes a cavity 108 in which a wafer 110 to be processed is placed. The baffle plates 102 and 104, in addition to being oriented parallel to each other, are also oriented parallel to the wafer 110 being processed. The baffle plates 102 and 104 may be the same or different sizes, of may have the same or different number of apertures. In a preferred embodiment, the upper baffle plate 102 has a smaller diameter than the lower baffle plate 104 as shown in FIG. 5.

Figure 7:
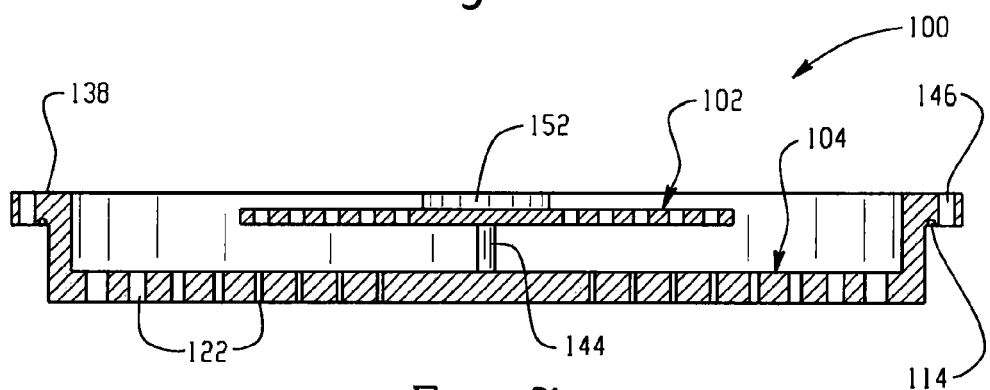
FIG. 7 is a sectional view of the baffle plate assembly of FIG. 6, taken along lines 6-6.

A seal 112 is provided at the interface between the baffle plate assembly 100 and the upper portion 106 of the process chamber, and resides within groove 114 in the lower baffle plate 104 (see FIG. 7). Wafers are introduced into and removed from the process chamber via a load lock mechanism (not shown) via entry/exit passageway 116. Alternatively, an atmospheric wafer handling system (not shown) can be employed to introduce and remove wafers to and from the process chamber. A heater mechanism (discussed below), located under the lower portion 106 of the process chamber, heats the underside of the wafer 110 to a desired temperature during processing.

The process chamber 16 is typically installed within the plasma ashing apparatus 10 intermediate to the heater assembly (below) and plasma-generating component 14 (above) at the locations of holes 118. During operation, energized plasma (gas) leaving the plasma tube 32 (see FIG. 3) encounters the baffle plate assembly 100. In a preferred embodiment, the energized plasma flowing from the plasma tube 32 first encounters a central area of upper baffle plate 102 that is substantially free of apertures. This central apertureless area has the function of eliminating the high axial gas velocity exiting the plasma tube 32 and accelerating the gas/plasma species in a radial direction in order to achieve proper operation of the plenum formed between the lower baffle plate 104 and the upper wall (i.e., lid) of the process chamber. The plasma is then distributed into the process chamber cavity 108 via apertures 120 in the upper baffle plate 102 and apertures 122 in the lower baffle plate 104. In one embodiment, the lower baffle plate 104 may be actively cooled with a cooling medium flowing through internal cooling passages 124 via inlets 126 and outlets 128. The walls 130 of the lower portion 106 of the process chamber may also be actively cooled with a cooling medium flowing through internal cooling passages 132 via inlet 134 and outlet 136.

Figure 6:
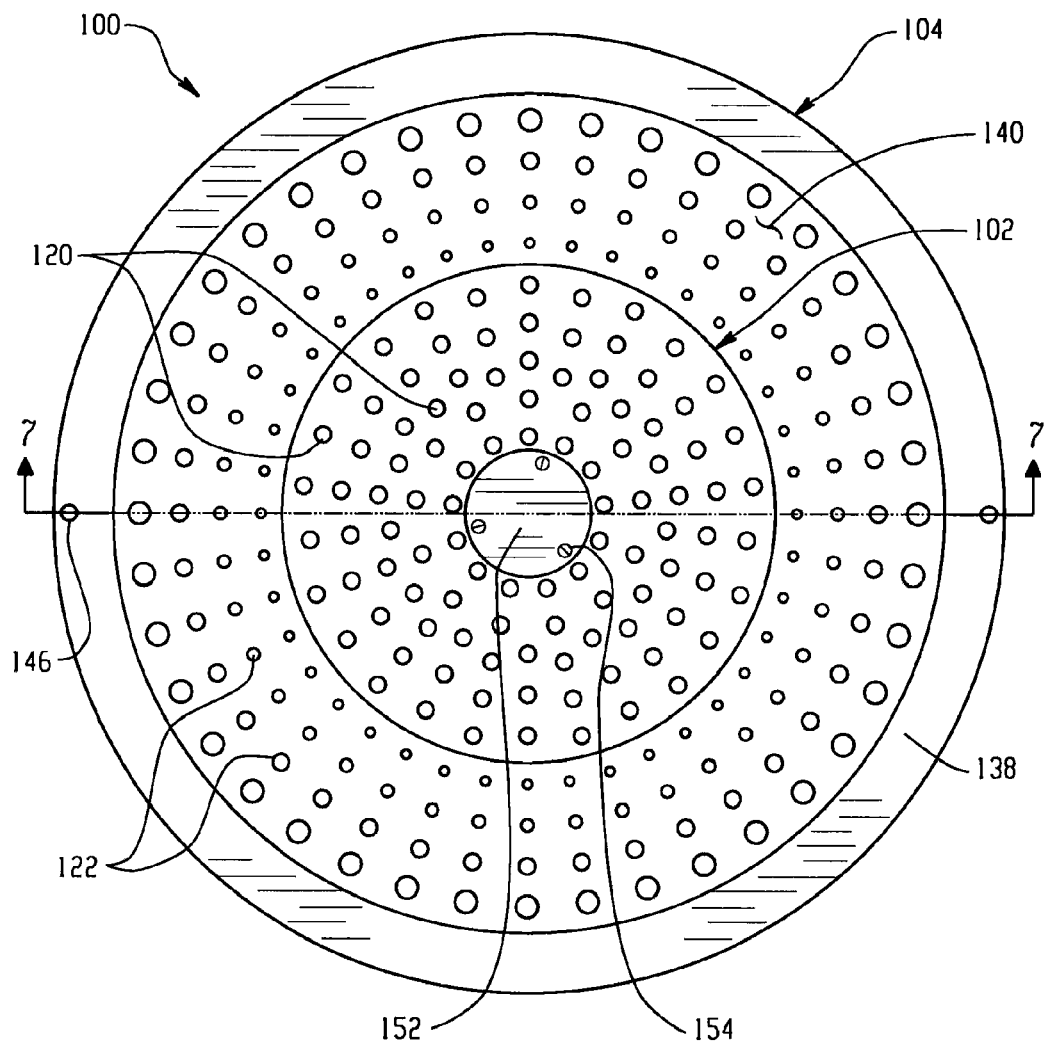
FIG. 6 is a plan view of the gas distribution system in accordance with one embodiment.

The lower baffle plate 104, as shown more clearly in FIGS. 6 and 7, comprises an outer flange 138 and a generally planar portion 140 that contains the apertures 122. Mounting holes (not shown) may be provided in the lower baffle plate 16 for mounting the upper baffle plate 1092 thereto by means of standoffs 144. The distance between the upper and lower baffle plates in part determines the pattern of gas flow through the baffle plate assembly 100. For a 300 mm plasma asher, the distance between the upper and low baffle plates, 102, 104, respectively, is preferably about 0.25 inches to about 2 inches, with a distance of about 0.5 to about 1.5 inches more preferred.

FIG. 6 is a plan view of the 300 mm baffle plate assembly shown in FIG. 5, and FIG. 7 is a sectional view of this embodiment of the baffle plate assembly 100. As shown in these Figures, the baffle plate assembly 100 is mounted to the upper portion 106 of the process chamber via mounting holes 146 in the lower baffle plate flange 138. Apertures 122 are provided in the lower baffle plate. The surface area of apertured portion 122 is sufficient to cover the wafer 110 residing therebelow (see FIG. 5). In this embodiment, the size of the apertures 122 increases from a centerpoint of the lower baffle plate to an outer edge. The increasing size of the apertures 122 improves plasma uniformity for oxygen and nitrogen free plasma discharges such as for use with carbon-containing low k dielectrics.

Figure 8:
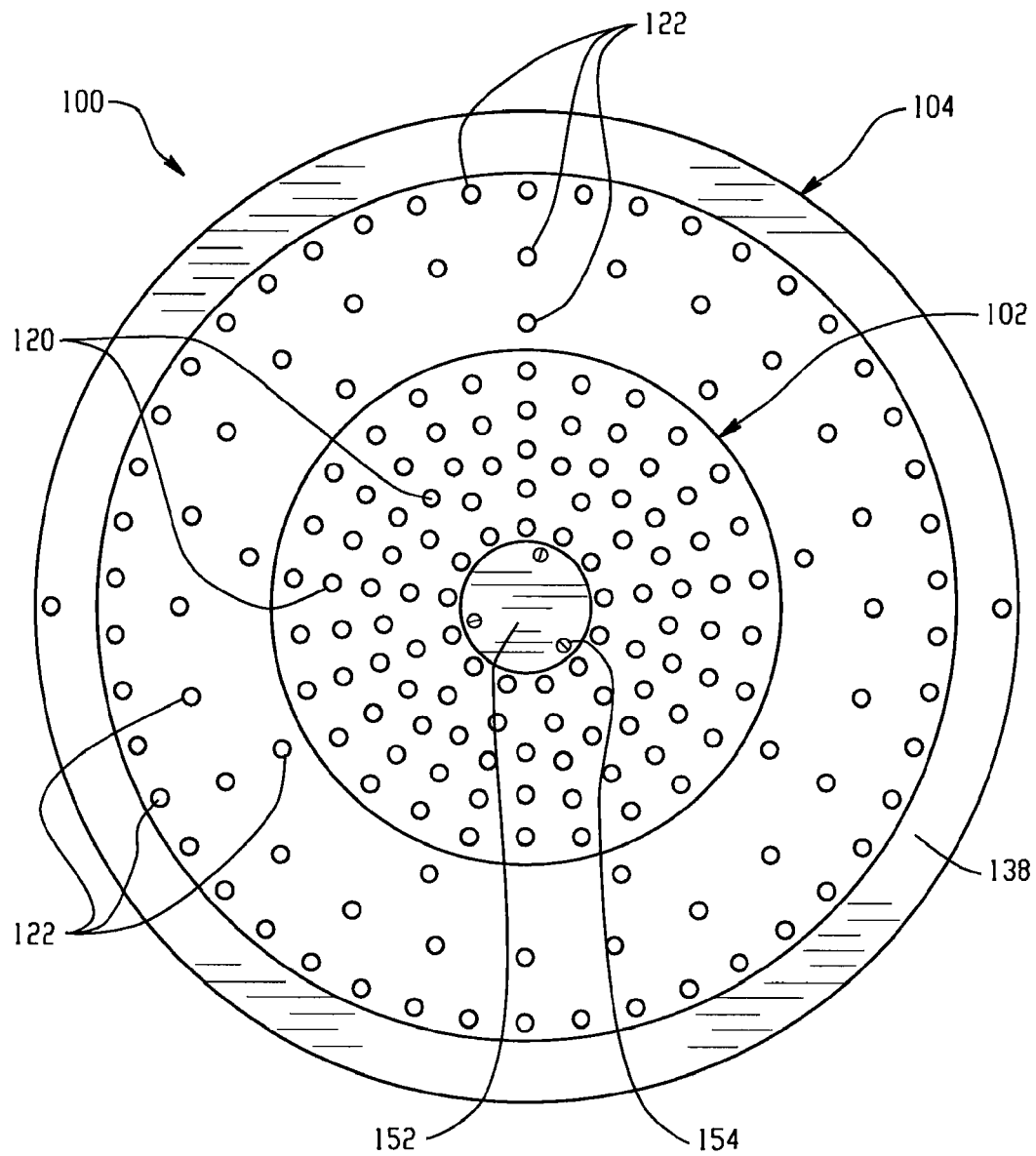
FIG. 8 is a plan view of the gas distribution system in accordance with another embodiment.

FIG. 8 illustrates a plan view of the lower baffle plate 104 in accordance with another embodiment. There, the density of the apertures 122 increases as one transitions from the center point of the lower baffle plate 104 to the outer edge, wherein the sizes of the apertures are the same.

The apertures 120 in the upper baffle plate 102 are generally arranged in a radial or concentric multiply circular pattern. The upper baffle plate 102 is comprised of sapphire-coated fused silica or quartz (SiO$_2$) or a ceramic material. The apertures 120 in the upper baffle plate 102 are preferably slightly larger than the largest apertures 122 in the lower baffle plate 104. Located at the center of the upper baffle plate 102 is a portion that is free of apertures and my further comprise a sapphire impingement disc 152. The center apertureless portion of the upper baffle plate 102, with or without the sapphire impingement disc 152, diverts energized gases emanating from the plasma tube 32 radially outward to the remaining apertured area of the upper baffle plate 102, so as to prevent the radially inward portion of the wafer 110 being processed from overheating and over-ashing at a proportionately higher rate than the rest of the wafer due to higher concentration of species at about the center. In an alternative embodiment, the upper baffle plate 102 can be configured to be completely apertureless, which may be useful for processing 200 mm wafers.

Heating of the substrate 110 is preferably accomplished by an array of tungsten halogen lamps 160 (see FIG. 1) positioned below the wafer 110, wherein the wafer is supported by lift pins within the process chamber. A plate 156 (the bottom wall of the process chamber as shown in FIG. 5) transparent to infrared radiation is disposed between the chamber 16 and the lamps 160. Preferably, the substrate is heated from about 80° centigrade (C) to about 350° C. during ashing. More preferably, the substrate is stepwise heated by incrementally increasing the temperature. Heating has been found to increase the reaction rate of the plasma with the photoresist and/or post etch residues and consequently, increase throughput. The amount of heat applied to the substrate will depend on the thermal stability of the particular low k dielectric layer as well as the other layers and components already formed in the substrate. In a preferred embodiment, the amount of heat is applied non-uniformly to selected zones of the substrate to facilitate uniform reaction of the plasma with the photoresist. In this embodiment, a controller (not shown) is in operative communication with the lamp array 160 for variously heating the substrate 110 to promote more uniform heating of the wafer during processing. An alternative method of heating the wafer is to use a flat heated surface in contact or in close proximity to heat the wafer, such as a heated chuck.

The substrate 110 is preferably simultaneously exposed to heat of sufficient intensity and duration, as well as to the nitrogen free and oxygen free plasma so as to cause volatile contaminants to diffuse out of the low-k dielectric layer and volatize without causing degradation of any other components or layers in the substrate. Preferably, for porous or non-porous doped oxide carbon-containing low k dielectric materials the wafer is heated from about 20° C. to about 400° C., with about 100° C. to about 300° C. more preferred. Preferably, for organic low k materials the wafer is heated from about 80° C. to a maximum of about 180° C. The maximum temperatures for organic dielectrics are dependent on the intrinsic properties of the organic low k material used and can be determined by thermal analysis techniques known to those skilled in the art. The temperature may be step-wise increased during processing or remain static.

Openings may also be disposed in the walls 130 of the process chamber 16 for purposes generally known in the art such as, for example, an optical port for monitoring endpoint detection in an in situ chamber cleaning process, a mass spectrometer inlet for analyzing gaseous species evolved during processing, or the like.

Additionally, the process chamber 16 includes an exhaust opening 158 centrally disposed in the bottom plate 156. Preferably, the exhaust opening 158 is coaxial with the plasma tube 32.

The operating pressures within the process chamber 16 are preferably about 100 millitorr to about 3 torr, with about 200 millitorr to about 2 torr more preferred, and with about 500 millitorr to about 1.5 torr even more preferred. Moreover, the process chamber 16 may further include additional features depending on the application. For example, a quartz window may be installed and a UV light source may be placed in proximity to the wafer. Such a non-columnar light source may have a wavelength similar to UV excimer lasers that have been shown to enhance photoresist removal in bulk strip applications and as such, could be used in parallel with microwave plasma generated reactive gases. Moreover, pre- and post-photoresist strip exposure to the light source could also provide residue removal and implanted resist removal advantages. Overhead RF sources, optical ports, gas analyzers, additional light sources, and the like could also be used either independently, or in combination, with the process chamber 16 providing an extremely flexible process platform.

Coupled to the process chamber 16 is the exhaust assembly component 18. The exhaust assembly component 18 includes an exhaust conduit 170 in fluid communication with an interior region of the process chamber 16. An inlet 172 of the exhaust conduit 170 is fluidly attached to opening 158 in the bottom plate 156 of the process chamber 16. The exhaust conduit 170 preferably has a substantially straight shape from inlet 172 to outlet 174, thereby minimizing high impact areas (e.g., sharp bends and curves in the conduit) and the propensity for buildup of photoresist material and plasma ashing byproducts at sharp bends. In a preferred embodiment, the exhaust conduit 170 is fabricated from quartz or sapphire coated quartz. A minimum diameter of the exhaust conduit 170 (and opening 156) is preferably at least about 2 inches for a 300 mm ashing apparatus (about a 1.5 inch diameter or greater is preferred for a 200 mm plasma ashing apparatus). By centrally locating the exhaust conduit 170 within the process chamber 16, flow from the plasma tube to the exhaust assembly is simplified and provides greater plasma uniformity.

The outlet 174 of the exhaust conduit 170 is preferably connected to vacuum system 176. An afterburner assembly 178 is in operative communication with the exhaust conduit 170. A gas inlet 180 and gas source 182 are in fluid communication with the exhaust conduit 170 and are positioned upstream from the afterburner assembly 178. The afterburner assembly 178 is employed to generate a plasma discharge within the exhaust conduit 170 so as to volatilize photoresist material and plasma byproducts discharged from the process chamber 16. As will be described in greater detail below, the gas source 180 is preferably an oxidizing gas such as oxygen or a combination of gases including oxidizing gases. Preferably, the oxidizing gas is free of halogens. In this manner, effluent from the process chamber into the exhaust conduit is mixed with the oxidizing gas source e.g., oxygen, and an oxygen containing plasma is formed from the mixture by the afterburner assembly 178, the manner of which is described below. It is preferred that the oxidizing gas is introduced to the afterburner assembly immediately above the assembly and is downstream from the exhaust opening 158 of the process chamber 16. Entry of oxygen into the process chamber 16 can deleteriously affect the low dielectric material in the manner previously described. The hardware and process for generating plasma in the exhaust conduit is preferably adapted to prevent oxygen from traveling upstream, i.e., back into the process chamber.

The afterburner assembly 178 preferably comprises an RF coil 183 wrapped about an exterior of the exhaust conduit 170 to inductively excite a gas mixture flowing through the exhaust conduit 170. Although reference is made to inductively coupling the gas mixture with RF power to form the plasma, other means could be employed in an effective manner such as by capacitive excitation or the like. Additionally, other frequencies in the ISM band including microwaves may be used to excite the afterburner plasma. The oxidizing gas is preferably introduced at inlet 180 upstream from the afterburner assembly 178. A throttle valve 184, foreline valve (not shown), vacuum pump 176, and other vacuum processing lines are disposed downstream from the afterburner assembly 178.

The RF coils 182 are connected to a suitable RF generator or power supply 186. The power supply frequency may vary, typically ranging from 400 KHz to the preferred value of 13.56 MHz at less than 600 watts (W), but may also be at higher frequencies and higher power. More preferably, an RF power of about 300 W to about 500 W is employed to inductively couple an oxygen species containing plasma in the exhaust conduit 170, which causes the organic matter contained therein to combust. As a result, deposition of photoresist material and other organic byproducts downstream from the process chamber is prevented and/or removed.

The RF connections are typically made through an RF matchbox 188 and the coils 182 are energized at the beginning of the plasma ashing process. The oxygen containing ($O_2$) gas admixture passing through the coupled RF field produces a plasma discharge that effectively and efficiently combusts organic matter. Preferably, the afterburner assembly 178 is configured to simultaneously operate during plasma ashing processing of a substrate 110 in the process chamber 16.

Additionally, the exhaust conduit 170 also includes an optical detection system 190. The optical detection system 190 optically detects emission peaks having particular wavelength ranges that correspond to the reaction byproducts (and reactants) of the reactions between the plasma and the photoresist. The technique relies on detecting the change in the emission intensities of characteristic optical radiation from the reactants and byproducts in the plasma. Excited atoms or molecules emit light when electrons relax from a higher energy state to a lower energy state. Atoms and molecules of different chemical compounds emit a series of unique spectral lines. The emission intensity for each chemical compound within the plasma depends on the relative concentration of the chemical compound in the plasma. A typical optical emission spectroscopy apparatus operates by measuring the emission intensities of the reactive etching gas and the by-product of the etching gas and the reactants. The emission decreases and finally stops when the byproduct is no longer in the viewing location, and an endpoint is reached. The optical emission spectroscopy apparatus senses the declining emission intensity of the by-product to determine this endpoint. Alternatively, the optical emission spectroscopy apparatus can sense the rise in reactant species once an endpoint is reached in the process chamber, such that either a rise in reactants or conversely, a fall in product emissions may be used to trigger endpoint. Advantageously, optical signals downstream from the discharge region of the afterburner assembly 178 can be used to clearly indicate what is occurring at the wafer surface in the process chamber. For example, an oxidizing agent such as oxygen is consumed when the plasma is ignited within the exhaust conduit 170 and combustion products are generated. The combustion products, e.g., carbon monoxide, carbon dioxide, water and the like, are those typically encountered during plasma ashing of photoresist with oxygen containing plasma discharges, but not typically from an oxygen free and nitrogen free plasma discharge. Since these species emit strong optical emission signals, an oxygen free and nitrogen free plasma process can be readily monitored for endpoint detection by analyzing the optical signals produced from the afterburner assembly in the exhaust conduit plasma discharge region. Once the signal of the monitored species is undetectable, it can be presumed that endpoint has been reached. As previously discussed, the use of oxygen free and nitrogen free plasma processes are desired for removing photoresist masks and the like from substrates containing carbon-containing low k dielectrics. Suitable oxygen free and nitrogen free plasma processes for use in the present disclosure are disclosed in pending U.S. patent application Ser. No. 09/855,177, to Waldfried et al., incorporated herein by reference in its entirety. The present process and apparatus provides a means for endpoint detection, which otherwise is generally difficult to directly detect in a process chamber in view of the species generated during an oxygen free and nitrogen free plasma ashing process.

The optical detection system 190 is coupled to the exhaust conduit. Collection optics 192 may be arranged outside the exhaust conduit 170 to collect the emission spectra thus passed, looking directly into the plasma generation region through the RF coils 182. Since the exhaust conduit 170 is preferably fabricated from an optically transparent material such as quartz or sapphire, an optical port or window is not necessary. In the event that an optically non-transparent material is employed for the fabrication of the exhaust conduit, an optical port of quartz or sapphire may be formed in the exhaust conduit. A spectrometer or monochromator (generally shown as 194 in FIG. 1) is arranged to receive light from the collection optics 192. Optical emission spectroscopy and techniques are generally well known on the art. In one embodiment, the optical emission spectroscopy is by a spectrometer, such as a CCD (charge couple device) based spectrometer or a PDA (photodiode array) based spectrometer, that time sequentially records a wavelength range and converts the emission spectra into analog signals for subsequent analysis. Optionally, narrow band filters can be used to permit evaluation of specific ranges of the wavelength of interest on a light detector such as a photomultiplier tube (PMT) or a photodiode. The spectrometer time sequentially converts light signals emitted during the combustion process in the afterburner assembly at specific wavelengths into an electrical analog signal, which can then be analyzed using methods known to those skilled in the art to produce a desired output. Preferably, the data is viewed in real time. Preferably, the data is viewed in graphical form showing the time evolution of the light intensity emitted during plasma processing for the wavelength range of interest. Additionally, the drop (or rise depending on the species monitored) in the optically induced analog signal can be used to trigger events on the machine. For example. Upon determining ashing endpoint has occurred from data collected by the optical detector in the exhaust conduit, the plasma ashing process can be immediately discontinued via a feedback loop.

Alternatively, other optical detectors can be used. For instance, as discussed above, a monochromator can be used to collect the data. As is known to those skilled in the art the monochromator can be configured with a photomultiplier tube, a photodiode or the like to record the emission signal.

These optical emission spectroscopy devices and suitable configurations within a plasma reaction chamber will be apparent to those skilled in the art in view of this disclosure. An example of a monochromator suitable for use in the present disclosure is model no. EP200MMD commercially available by the Verity Corporation. An example of a scanning monochromator suitable for use in the present disclosure is model no. EP200SMD commercially available by the Verity Corporation. Examples of CCD based spectrometers suitable for use in the present disclosure are Model Nos. SD1024 commercially available by Verity Corporation, and series PC2000 CCD spectrometers commercially available from Ocean Optics. An example of a photodetector array suitable for use in the present disclosure is model no. SPM9001 commercially available from the Prema Company, Germany.

Preferably, the endpoint detection process and apparatus is used with substrates, wherein the low k materials contain carbon and/or hydrogen within its structure such as doped oxides, porous materials and organic low k films. The carbon-containing low k dielectric materials may include pendant groups that contain carbon or may be carbon containing wherein the backbone of the dielectric material is primarily comprised of an interconnecting network of carbon. The process employing the nitrogen-free and oxygen-free plasma provides high ashing selectivity and overcomes the problems noted in the prior art that occur from ashing photoresist, polymers and residues from carbon and/or hydrogen based low k dielectric materials. Moreover, the process alleviates the subsequent metal filling problems caused by nitrogen in the ashing plasma.

The ashing process includes generating reactive species from a plasma gas mixture and exposing a substrate to the reactive species. The particular components of the plasma gas mixture are selected by their ability to form a gas and plasma under plasma forming conditions. The gas mixture selected is free from components that generate reactive oxygen species and reactive nitrogen species under plasma forming conditions. More preferably, the gas mixture is free from oxygen-containing compounds and nitrogen-containing compounds. The gas mixture may include a number of reactive gases that are hydrogen-bearing gases, e.g., hydrogen gas, hydrocarbon gases, and the like. The gas mixture may further comprise an inert gas such as argon, helium, neon and the like. The plasma generated from the gas mixture primarily reacts with carbon and other atoms in the photoresist, polymers, and residues to form compounds that are volatile under the temperature and pressure conditions at and about the substrate and/or rinse removable compounds. The process is optimized to have a selectivity greater than 50:1.

Hydrogen-bearing gases suitable for use in the process include those compounds that contain hydrogen. The hydrogen-bearing gases include hydrocarbons, hydrogen gas or mixtures thereof. Preferred hydrogen-bearing gases exist in a gaseous state under plasma forming conditions and release hydrogen to form reactive hydrogen such as atomic hydrogen species and other hydrogen radicals under plasma forming conditions. The hydrocarbons are preferably unsubstituted. Examples of suitable hydrogen-bearing hydrocarbon gases include methane, ethane and propane.

Preferred hydrogen-bearing gases are mixtures of a hydrogen bearing gas and a noble gas. Examples of noble gases suitable for use in the process include a gas in Group VIII of the periodic table such as argon, neon, helium and the like. Although prior art oxygen-free plasma discharges generally use a forming gas composition that includes a hydrogen and nitrogen gas mixture, the use of nitrogen gas in the process is expressly excluded. Consequently, since forming gas is hereinafter defined as a gas containing a mixture of hydrogen and nitrogen gases, the use of forming gas in the process is expressly excluded. Particularly preferable for use in the present invention is a gas mixture that includes hydrogen and helium gases. Helium gas atoms are light and readily diffuse to the substrate, which results in excellent carrier characteristics for plasma generated reactive hydrogen species.

For safety reasons, the percentage of hydrogen gas in the gas mixture generally does not exceed about 5 percent by volume of the gas mixture. However, higher amounts of hydrogen are acceptable and sometimes preferred for increasing the photoresist removal rate and selectivity. Preferably, the amount of hydrogen in the gas mixture is from about 1 to about 99 percent of the total volume. More preferably, the amount of hydrogen in the gas mixture is from about 10 to about 30 percent of the total volume.

In operation, the semiconductor wafer 110 with photoresist and/or post etch residues thereon (and a carbon-containing low k dielectric material) is placed into the process chamber 16 on wafer support pins. The wafer 110 is preferably heated by infrared lamps 160 to accelerate the reaction of the photoresist and/or post etch residues with the plasma. The pressure within the process chamber 16 is then reduced. Preferably, the pressure is maintained between about 1 torr to about 5 torr. An excitable oxygen free and nitrogen free gas mixture is fed into the purifier and then the plasma tube 32 of the plasma-generating component 14 via a gas inlet 24. Each section 26, 28, 30 of the plasma generating component 14 is fed with microwave energy to excite a plasma in the plasma tube 32, which plasma is comprised of electrically neutral and charged particles. The charged particles are preferably selectively removed before the plasma enters the process chamber 16. The excited or energetic atoms of the gas are fed into the process chamber and uniformly distributed across the wafer where the atomic hydrogen reacts with the photoresist and/or post etch residues, which causes removal of the photoresist material and also forms volatile byproducts. The photoresist material and volatile byproducts are continuously swept away from the wafer surface to the centrally located exhaust conduit 170.

Simultaneously with plasma ashing, an oxidizing gas is fed into the exhaust conduit 170 downstream from the process chamber 16. No oxygen enters the process chamber 16 due to the "plug-flow" condition imposed by the much larger helium hydrogen flow rate from the process chamber into the exhaust conduit 170. The afterburner assembly 178 is energized to form high-density plasma within the exhaust conduit 170. For an exhaust conduit 170 configured with a CCD based spectrometer, the CCD spectrometer time sequentially records an emission spectrum that includes emission signals corresponding the photoresist material and volatile byproducts, if present. The wavelength range of the emission spectrum monitored is determined by the type of CCD spectrometer used and the presence of any filters used to eliminate certain wavelength emissions from reaching the CCD spectrometer. The CCD spectrometer configuration simultaneously records the background radiation and the radiation from the emitted species during the ashing process. Using standard algorithms known to those skilled in the art, the background radiation can be subtracted from the radiation resulting from the reaction of the plasma with the photoresist and/or byproducts. Once the emission peak records a change in intensity values and the conditions set by an endpoint algorithm are met, the removal of photoresist and/or residues is complete, a signal is then sent to a control unit and the plasma can be turned off. The vacuum is released and the processed wafers may be removed from the process chamber. An optional water rinse is used to remove any remaining residue on the stripped wafer.

In a plasma asher with a monochromator, blank uncoated wafers are first exposed in the process chamber 16 and a first emission signal at a desired wavelength is measured in the exhaust conduit 170. The first emission signal represents the background radiation as discussed above. Next, substrates having photoresist and/or residues thereon (and containing a carbon-containing low k dielectric material) are exposed to plasma in the process chamber. A second emission signal emitted in at the desired wavelength is recorded in the exhaust conduit by the monochromator. The background radiation of the first emission signal is subtracted from the second emission signal. When the second emission signal at the desired wavelength reaches a steady state and is about the same or below the first emission signal, the ashing endpoint has been reached in the process chamber 16 and a signal is then sent to a control unit in the plasma asher 10 and the plasma is turned off. The vacuum is then released and the processed wafers are removed from the process chamber. An optional water rinse is then used to remove any remaining residues on the stripped wafer.

Other monochromators, spectrometers or like configurations and operations thereof for monitoring the plasma byproducts discharged from the process chamber will be apparent to those skilled in the art in view of this disclosure. Preferably, one or more of the emission signals at 283 nm, 309 nm, about 387 nm, about 431 nm, about 434 nm, about 468 nm, about 472 nm, about 513 nm, about 516 nm, about 656 nm, about 668 nm, about 777 nm, about 845 nm (± about 5 to about 10 nm) are monitored in the exhaust conduit 170. These emission signals represent spectral peaks for photoresist materials, reactants, and plasma byproducts formed by a mixture of photoresist components, the nitrogen free and oxygen free effluent from the process chamber, and the oxygen plasma discharge generated by the afterburner assembly. For example, so called "Swan bands" correlating to the dimer C2 are evident at about 513 nm and about 517 nm. Upon addition of an oxidizing gas in the exhaust conduit, emission signals from CO/CH species at about 431 nm and CN species at about 387 nm can be readily monitored. Since most I-line photoresists are based on diazonapthoquinone chemistry, monitoring the emission signal intensity for CN is quite useful for ashing endpoint detection of I-line photoresists. Moreover, the intensity of the emission signals can increase or decrease within the exhaust conduit, which can be also used to determine endpoint of the ashing process in the process chamber. For example, during plasma ashing of photoresist in the process chamber, the intensity can increase for emissive species correlating to H at about 434 nm and at about 656 nm, OH at about 283 nm and 309 nm, and O at about 777 nm as ashing of the photoresist nears completion. In this manner, an oxygen free and nitrogen free plasma ashing process can be used to remove the photoresist material and post etch residues from substrates containing carbon-containing low k dielectrics whereas a second oxidizing plasma is formed in the exhaust conduit 170 to determine ashing endpoint for the oxygen free and nitrogen free plasma by monitoring the emission signals of the reactants and/or products in the exhaust conduit 170.

Unless otherwise specified, the materials for fabricating the various components 12, 14, 16, and 18 include metals, ceramics, glasses, polymers, composite materials, and combinations comprising at least one of the foregoing materials. For example, suitable metals include anodized aluminum, and/or stainless steel. Suitable ceramic materials include silicon carbide, or aluminum oxide (e.g., single crystal or polycrystalline).

The following examples are presented for illustrative purposes only, and are not intended to limit the scope of the disclosure.

EXAMPLE 1

Figure 9:
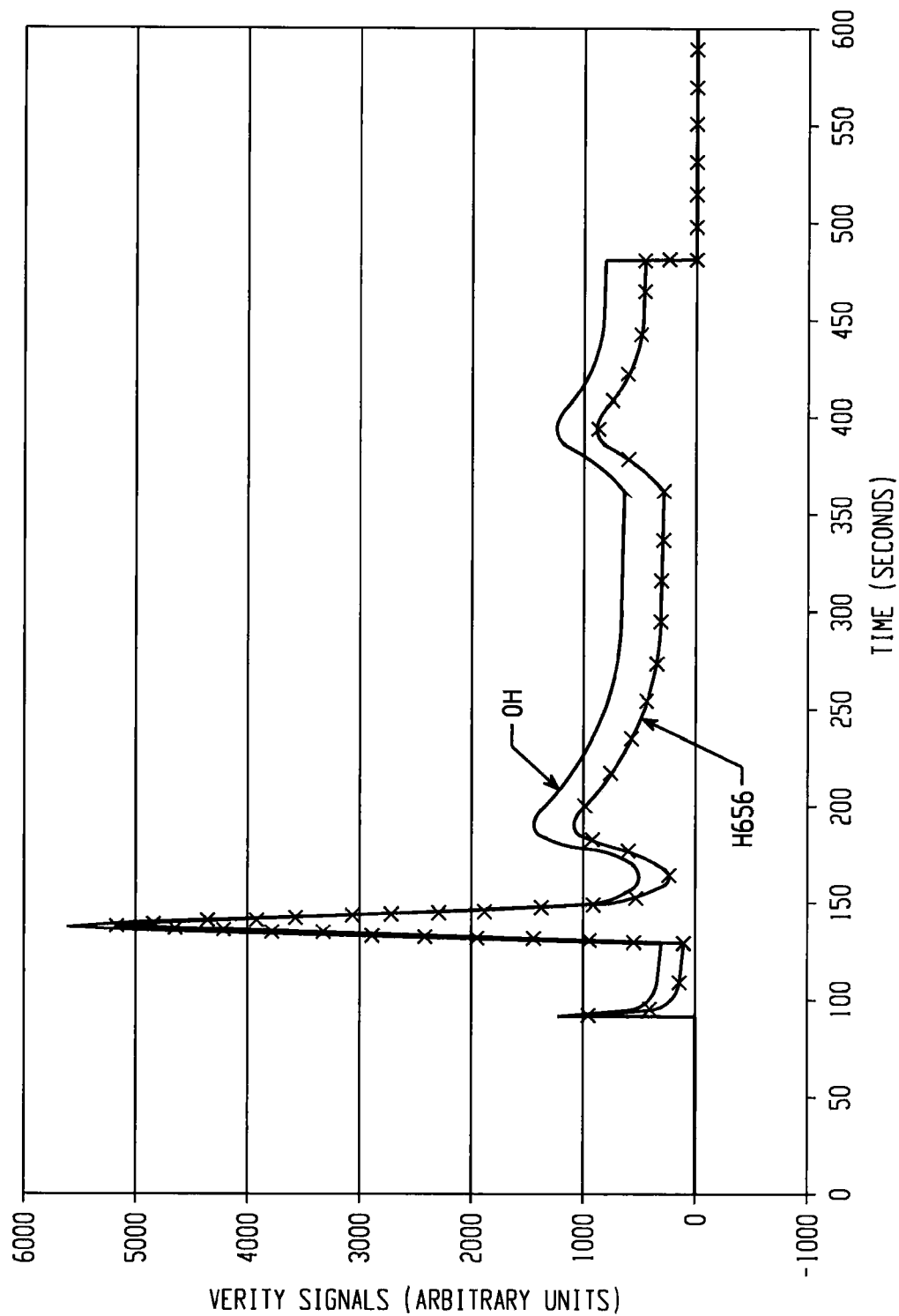
FIG. 9 is a graph illustrating a time evolution of a light intensity emitted for OH species generated from sublimated organic matter removed from a wafer due to heating the wafer to a temperature of 300° C. in an oxygen free and nitrogen free environment and oxidized in an exhaust conduit of a plasma ashing apparatus.

In this example, optical signals for OH and H were monitored in the exhaust gas conduit downstream from an afterburner in a plasma ashing apparatus as shown in FIG. 1. Helium was introduced into the plasma apparatus at a flow rate of 7,000 sccm and at a pressure of 1.5 torr. A substrate containing photoresist was exposed to heating lamps to slowly heat the wafer to 300° C. and volatilize organic matter from the wafer surface. No plasma was created in the process chamber at this time. During operation of the afterburner at an RF power of 500 W, oxygen gas was introduced into the exhaust conduit at a flow rate of 1,000 sccm. No oxygen was introduced into the process chamber. The optical signals for OH and H were monitored in the exhaust conduit over a period of time to determine endpoint of the plasma ashing process in the process chamber. FIG. 9 graphically illustrates light intensity for these optical signals as a function of time. It was observed that as the organics sublimed from the wafer were oxidized in the afterburner. Since different organic species sublimate at different temperatures, the multiple peaks shown in FIG. 9 correspond to different temperature settings. If plasma were used in the process chamber simultaneously with the wafer heating, it is believed that neither of these signals (corresponding to H and OH) could be employed for endpoint detection in the process chamber since there is no emission of consequence in the process chamber for these species.

EXAMPLE 2

Figure 10:
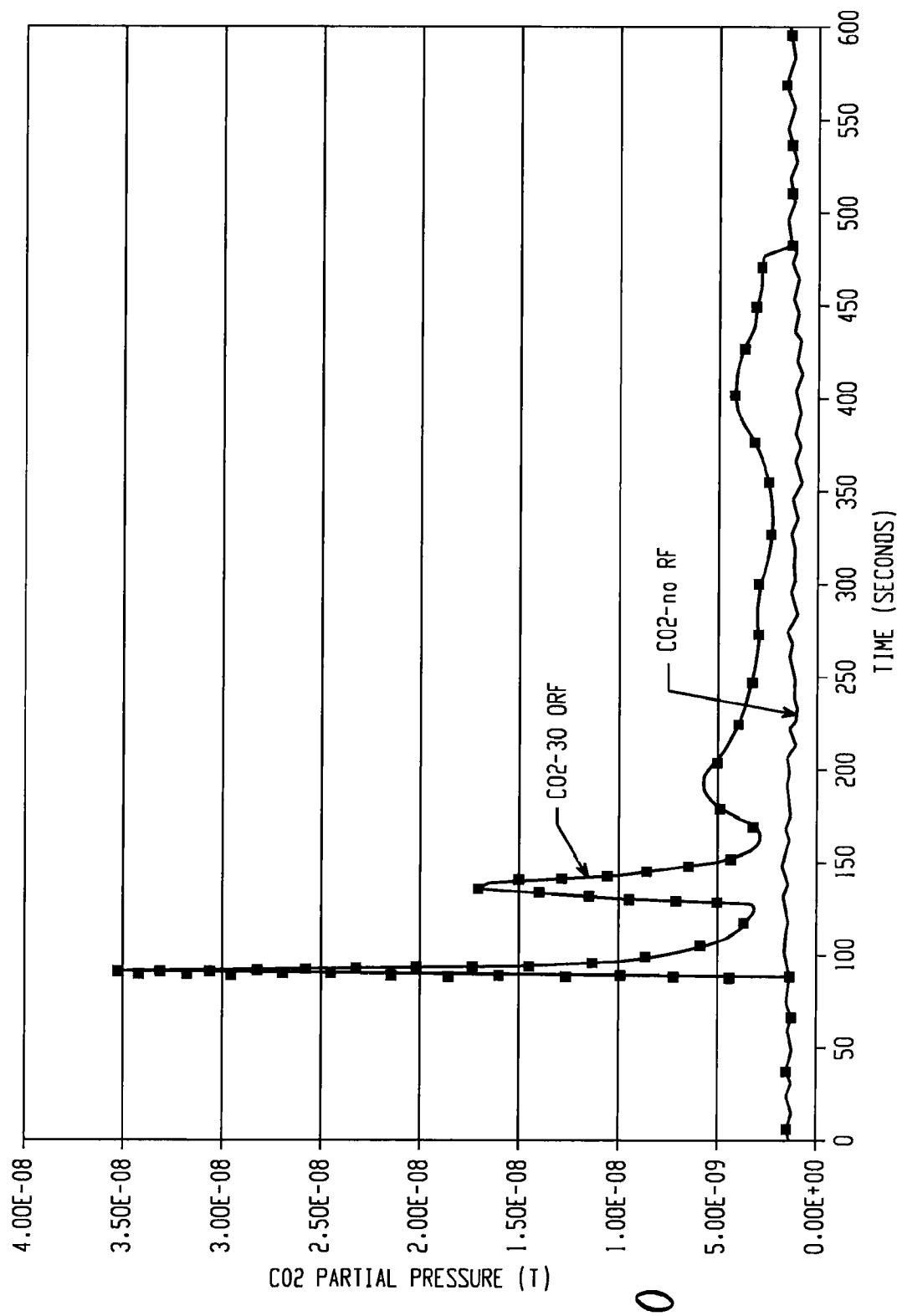
FIG. 10 is a graph illustrating a time evolution of carbon dioxide partial pressure as measured with a residual gas analyzer in an oxygen free and nitrogen free plasma and oxidized in an exhaust conduit of a plasma ashing apparatus.

In this example, $CO_2$ was monitored in an exhaust conduit of a plasma asher apparatus as shown in FIG. 1. $CO_2$ was monitored by a residual gas analyzer with and without plasma formed by an afterburner disposed in the exhaust conduit. Similar to Example 1, a resist coated wafer was slowly heated to 300° C. in the process chamber without exposure to plasma. Helium was introduced into the plasma apparatus at a flow rate of 7,000 sccm and at a pressure of 1.5 torr. During operation of the afterburner at an RF power of 300 W, oxygen gas was introduced into the exhaust conduit at a flow rate of 1,000 sccm. No oxygen was introduced into the process chamber. FIG. 10 graphically illustrates $CO_2$ generation as a function of time resulting from generating plasma in the exhaust conduit. If the afterburner was not used, no detectable CO emission would result. However, exposing the organics from the process chamber to the afterburner resulted in strong emission of CO It is noted that within the 2' process chamber, no signal would be emitted from CO even if the wafer were exposed to the oxygen free and nitrogen free plasma, e.g., plasma formed from a helium and hydrogen gas mixture.

EXAMPLE 3

Figure 11:
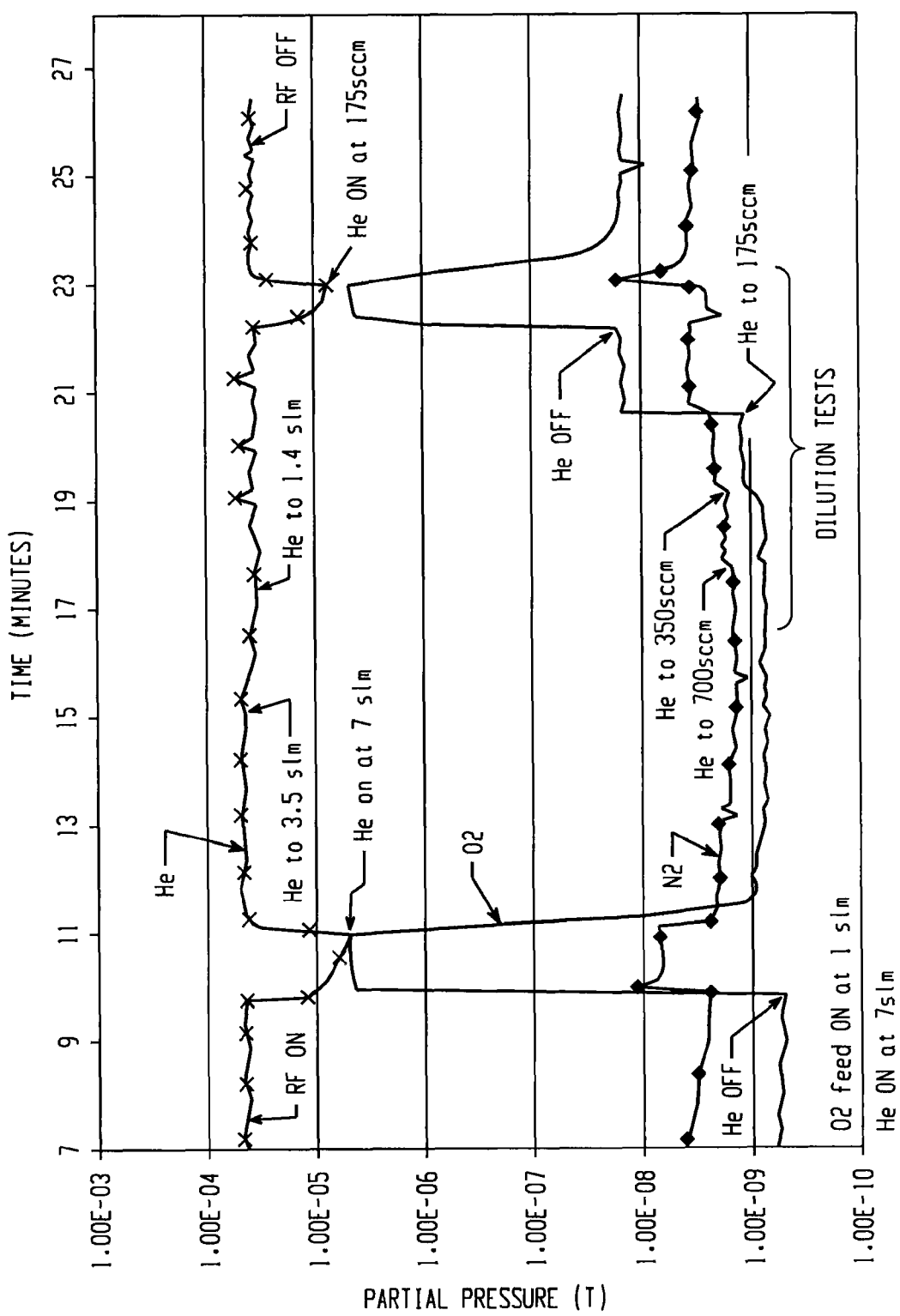
FIG. 11 is a graph illustrating residual gas analysis of partial pressures for helium, nitrogen, and oxygen measured upstream from the afterburner and inlet for introducing oxygen gas into an exhaust conduit of a plasma asher apparatus (i.e., downstream from the wafer process chamber), wherein the flow rate of helium is varied.
Figure 12:
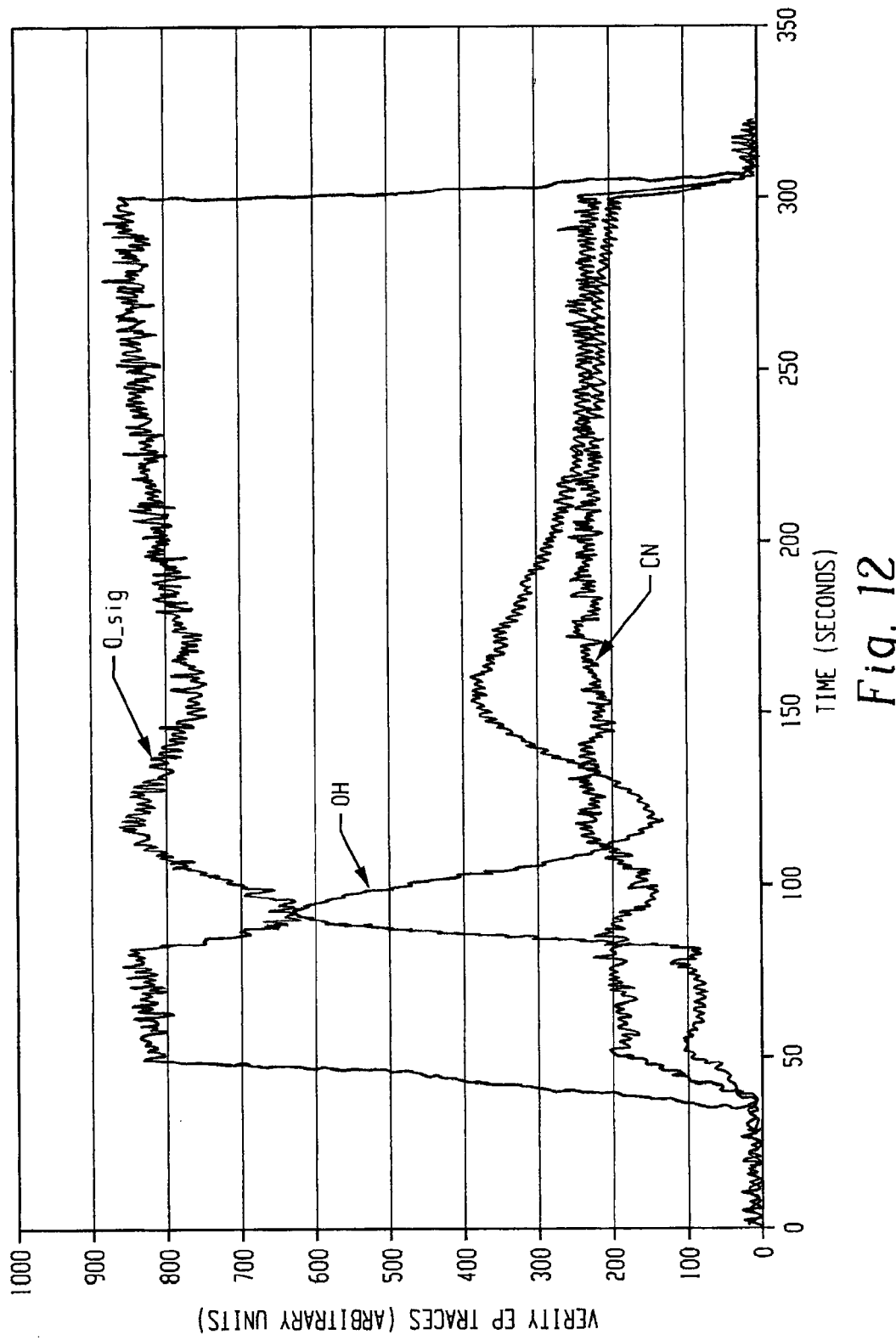
FIG. 12 is a time evolution of optical signals showing various photoresist constituents (O and CN) and product (OH) produced upon stepwise heating of a photoresist-coated wafer.

In this example, dilution tests were performed to determine the minimum upstream helium flow rates to prevent backstreaming of the oxygen gas into the process chamber. Oxygen was flowed at a rate of 1,000 sccm into the exhaust conduit. A helium gas was flowed into the plasma apparatus initially at a flow rate of 7,000 sccm and was stepwise decreased. Residual gas analysis was taken upstream of the afterburner to monitor partial pressures of helium, nitrogen, and oxygen. FIG. 11 graphically illustrates partial pressures of helium, nitrogen and oxygen as a function of time and dilution. At a helium flow rate of about 175 sccm, it is observed that oxygen is backstreaming into the upstream residual gas analyzer, which could potentially be detrimental for plasma ashing carbon-containing low k dielectric.

EXAMPLE 4

In this example, a resist coated wafer is heated slowly, with 7 standard liters per minute (slm) of helium flow in the chamber, and 1 slm of O₂ flow in the side-feed of the afterburner. Time evolution of the optical signals for the reactants (O, CN) and the product (OH) are observed. As the wafer begins to heat, volatile byproducts sublimate and are consumed in the afterburner. The OH signal rises to show this, with a corresponding drop in the O signal. Also, carbon, which was being used to create CN, is now used to make CO and $CO_2$, with a corresponding drop in the CN signal.

EXAMPLE 5

Figure 13:
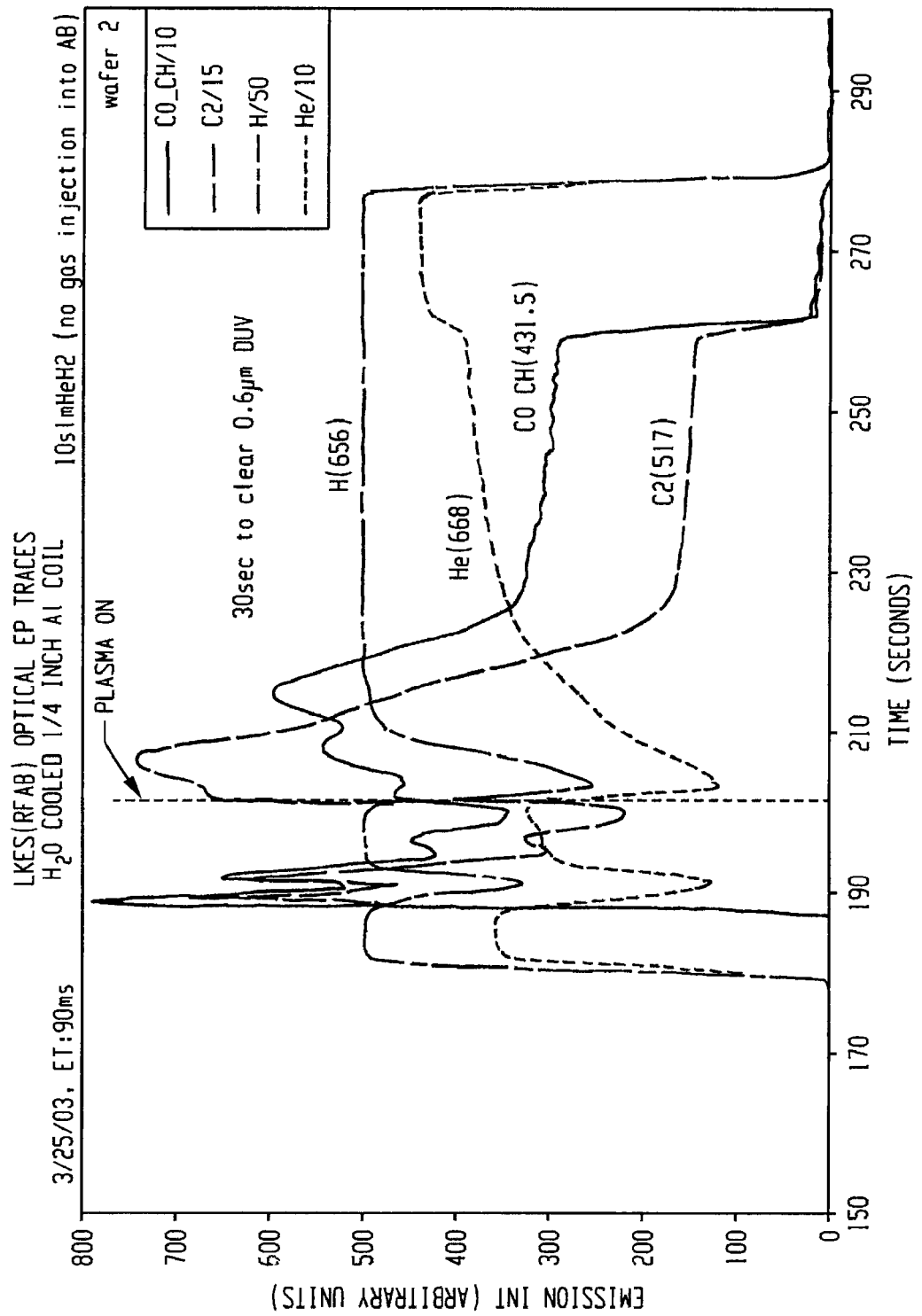
FIG. 13 is a time evolution of a DUV photoresist removal process using a hydrogen/helium ashing process without employing an oxidizing gas in the endpoint monitoring process.

In this example, 6,000 angstroms of DUV photoresist was coated onto wafers and treated in a plasma ashing apparatus similar to the one as shown and described with reference to FIG. 1. A 4% hydrogen and 96% helium gas mixture (percentages by volume) at a flow rate of 10 slm was introduced into the plasma tube from which plasma was generated. The wafer was exposed to the plasma in the process chamber and the effluent produced therein was discharged from the process chamber into the exhaust conduit. Wavelengths correlating to CO/CH (431 nm), C2 dimer (517 nm), H (656 nm), and He (668 nm) species were monitored in the exhaust conduit after passing through the energized afterburner. The results are shown in FIG. 13.

As shown, the hydrogen/helium plasma ashing process took about 30 seconds to remove the photoresist material. Hydrogen and helium species increased as a function of time indicating that these species were decreasingly involved in the plasma ashing removal of the photoresist material in the process chamber. In contrast, the C2 dimer and CO/CH emissive species decreased as a function of time since these species are no longer generated the wafer is clear of photoresist. Any one or a combination of the species monitored can provide a robust endpoint measurement process.

EXAMPLE 6

Figure 14:
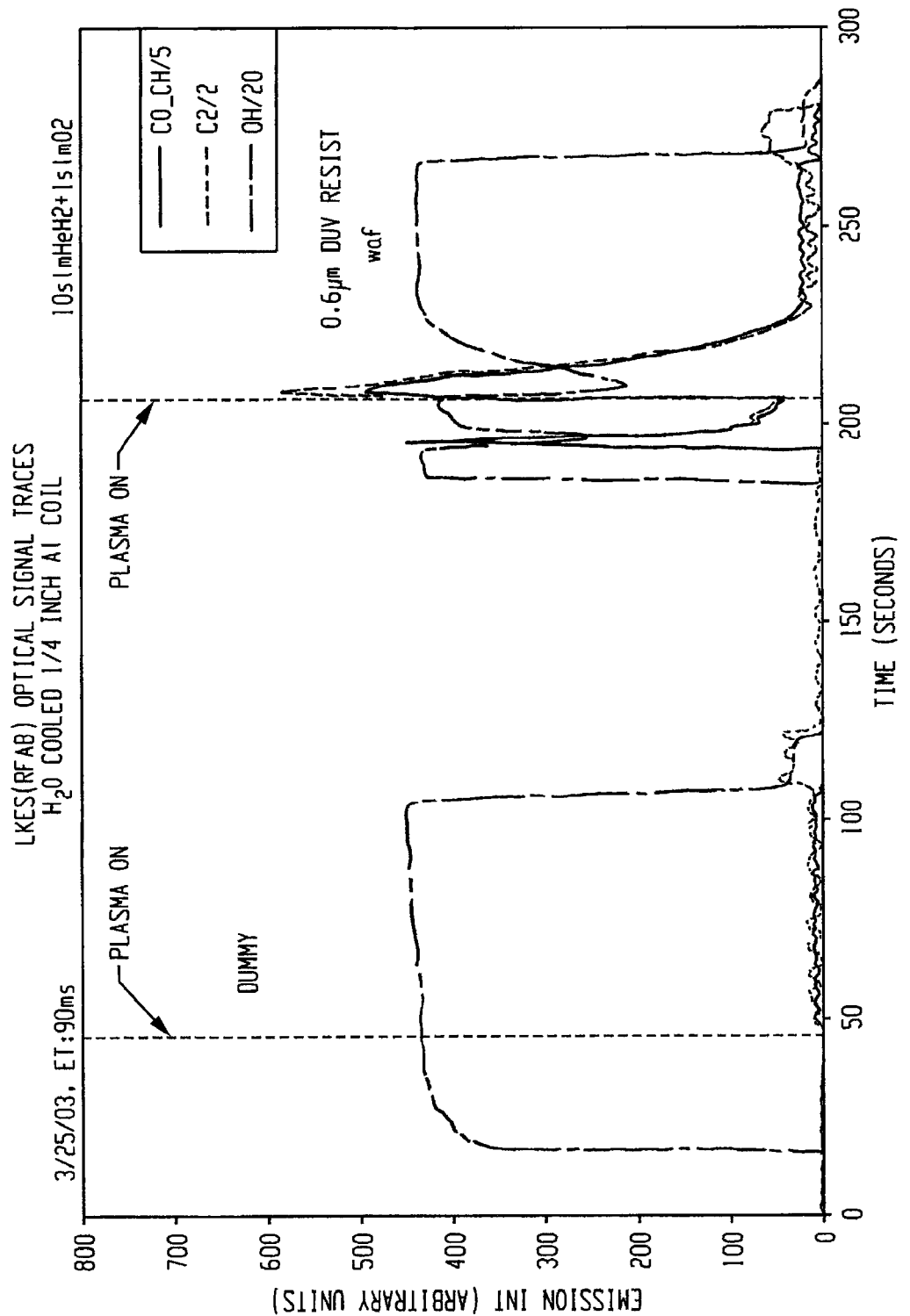
FIG. 14 is a time evolution of a DUV photoresist removal process using a hydrogen/helium ashing process and employing an oxidizing gas in the endpoint monitoring process.

In this example, 6,000 angstroms of DUV photoresist was coated onto the wafers and treated in a plasma ashing apparatus as in Example 5. Oxygen at a flow rate of 1 slm was introduced into the exhaust conduit (i.e., afterburner assembly but not in the process chamber) to produce an oxidizing plasma in the exhaust conduit with the oxygen free and nitrogen free plasma effluent produced in the process chamber by the hydrogen/helium ashing process. Wavelengths correlating to CO/CH (431 nm), C2 dimer (517 nm), and OH (309 nm) species were monitored in the exhaust conduit after passing through the energized afterburner. In this example, dummy wafers (no photoresist material) were also exposed to the same process. The results are shown in FIG. 14.

At about 20 to about 110 seconds, no change in emission intensities was observed with the dummy wafers. At about 185 to about 270 seconds, a change in emission signal intensities is observed with the coated wafers as the photoresist is stripped therefrom.

EXAMPLE 7

Figure 15:
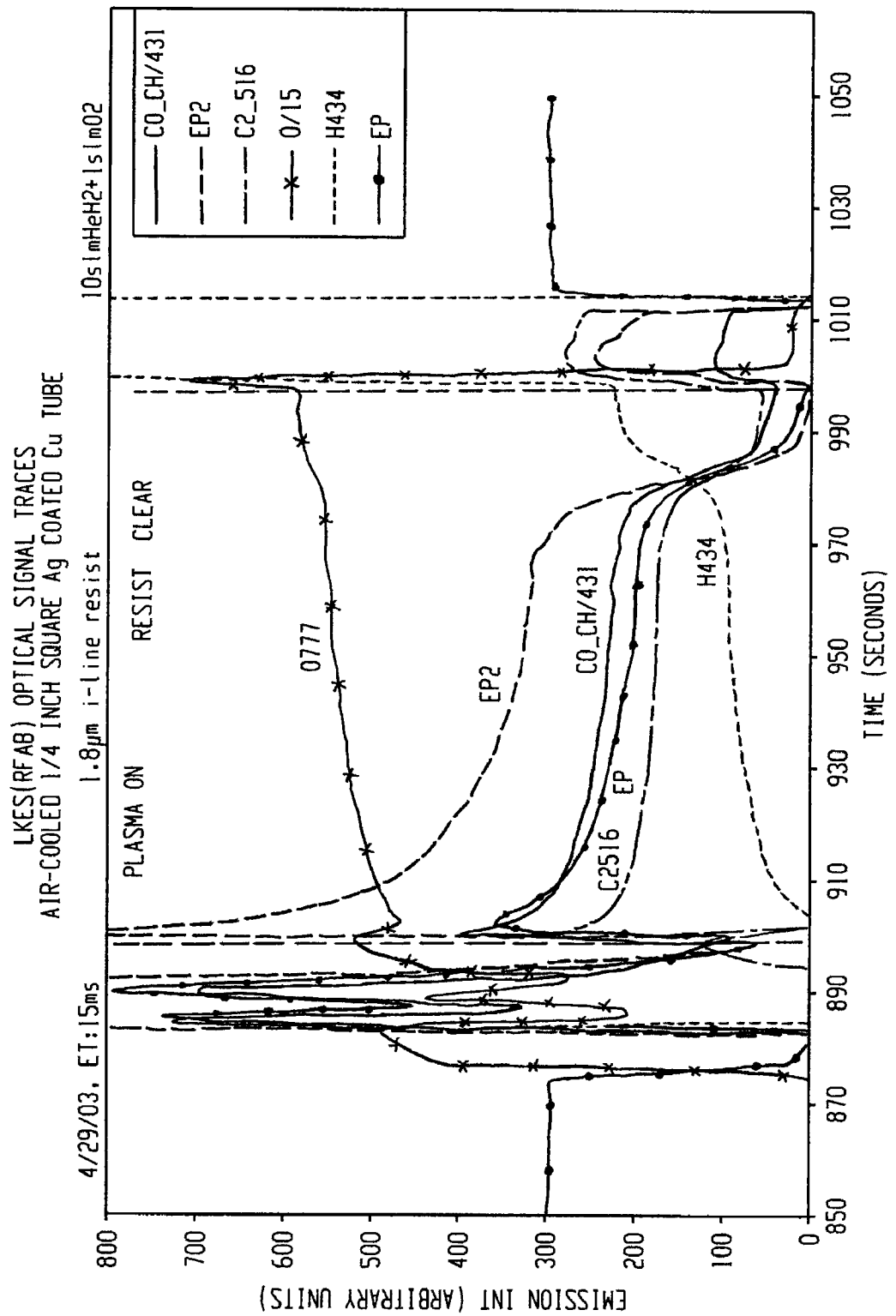
FIG. 15 is a time evolution of an I-line photoresist removal process using a hydrogen/helium ashing process and employing an oxidizing gas in the endpoint monitoring process.

In this example, an l-line photoresist coated at a thickness of 1.8 microns was processed in the plasma ashing apparatus similar to the one as shown and described with reference to FIG. 1. A 4% hydrogen and 96% helium gas mixture (percentages by volume) at a flow rate of 10 slm was introduced into the plasma tube from which plasma was generated. Oxygen was introduced into the exhaust conduit at a flow rate of 1 slm. Wavelengths correlating to CO/CH (431 nm), C2 dimer (517 nm), 6 (777 nm and 845 nm), and H (434 nm) species were monitored in the exhaust conduit after passing through the energized afterburner. The results are shown in FIG. 15.

Reference to EP and EP2 refer to an algebraic manipulation of the 4 traces to provide greater signal to noise ratio. As shown, endpoint detection can be accurately determined using individual wavelengths or by providing an algorithm of the four traces. Here, the photoresist was removed after a plasma ashing process of about 100 seconds.

While the disclosure has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for detecting an endpoint for an oxygen free and nitrogen free plasma ashing process, comprising:
   exposing a substrate comprising photoresist material and/or post etch residues thereon to the oxygen free and nitrogen free plasma in a process chamber, wherein the oxygen free and nitrogen free plasma source is generated remotely and introduced into the process chamber;
   removing the photoresist material and/or post etch residues from the substrate;
   exhausting the removed photoresist material and/or post etch residues from the process chamber into a single exhaust conduit fluidly coupled to the process chamber, wherein the exhaust conduit has a substantially straight shape extending from an outlet of the process chamber;
   selectively introducing an oxidizing gas into the exhaust conduit;
   generating a plasma from the oxidizing gas and the exhausted photoresist material and/or post etch residues to form emissive species within the exhaust conduit; and
   optically monitoring an emission signal within the exhaust conduit produced by the emissive species to determine the endpoint of the oxygen free and nitrogen free plasma ashing process.

2. The method of claim 1, wherein the emission signal produced by the emissive species is monitored at one or more wavelengths of about 283 nm, about 309 nm, about 387 nm, about 431 nm, about 434 nm, about 468 nm, about 472 nm, about 513 nm, about 516 nm, about 656 nm, about 668 nm, about 777 nm, and/or of about 845 nm.

3. The method of claim 1, wherein exposing the substrate to the oxygen free and nitrogen free plasma in the process chamber and generating the oxygen plasma in the exhaust conduit occurs simultaneously.

4. The method of claim 1, wherein the substrate comprises a carbon and/or hydrogen containing insulating layer having a dielectric constant less than about 3.5.

5. The method of claim 1, wherein the an oxygen free and nitrogen free plasma ashing process comprises generating the oxygen free and nitrogen free plasma from a gas mixture comprising hydrogen or helium or a combination comprising at least one of the foregoing gases.

6. The method of claim 1, further comprising preventing backstreaming of the oxidizing gas into the process chamber.

7. An endpoint detection process for an oxygen free and nitrogen free plasma ashing process for removing photoresist and/or residues from a substrate, comprising:

remotely generating and introducing an oxygen free and nitrogen free plasma into a process chamber, wherein the process chamber comprises an inlet for receiving the oxygen free and nitrogen free plasma, an outlet for discharging plasma removed photoresist and/or residues, and a single exhaust conduit having a substantially straight shape extending from the outlet;

removing the photoresist and/or residues with the an oxygen free and nitrogen free plasma to form a plasma discharge;

introducing an oxidizing gas and the plasma ashing discharge into the exhaust conduit of a plasma asher apparatus, wherein the plasma ashing discharge comprises photoresist material, post etch residues, and post ashing products, and wherein the plasma ashing discharge into the exhaust conduit is free from nitrogen and oxygen species;

generating a plasma from the oxidizing gas and the plasma ashing discharge to form emissive species within the exhaust conduit; and optically monitoring emission signal intensities within the exhaust conduit correlating to the emissive species, wherein an endpoint of the oxygen free and nitrogen free plasma ashing process is detected when the emission signal intensities correlating to the emissive species substantially change to an amount greater or less than a predetermined threshold.

8. The endpoint detection process of claim 7, wherein the emission signal intensity is at a wavelength selected from the group consisting of about 283 nm, about 309 nm, about 387 nm, about 431 nm, about 434 nm, about 468 nm, about 472 nm, about 513 nm, about 516 nm, about 656 nm, about 668 nm, about 777 nm, about 845 nm, and a combination of at least one of the foregoing wavelengths.

9. The endpoint detection process of claim 7, wherein the substrate comprises a carbon and/or hydrogen containing insulating layer having a dielectric constant less than about 3.5.

10. The endpoint detection process of claim 7, wherein the oxidizing gas comprises oxygen.

11. The endpoint detection process of claim 7, wherein optically monitoring the emissive species comprises focusing collection optics of an optical detector at or about a plasma discharge region for the plasma from the oxidizing gas and the plasma ashing discharge.

12. A method for determining an endpoint of an oxygen free and nitrogen free plasma ashing process used for stripping photoresist material from a substrate having a carbon-containing low k dielectric material, comprising:

exposing the substrate to the oxygen free and nitrogen free plasma ashing process in a process chamber to remove the photoresist material from the substrate and form volatile byproducts, wherein the oxygen free and nitrogen free plasma ashing process comprises introducing a remotely generated oxygen free and nitrogen free plasma into a process chamber having the substrate therein;

exhausting the photoresist material and volatile byproducts from the process chamber into a single exhaust conduit having a substantially straight shape extending from the outlet;

selectively introducing an oxidizing gas into the exhaust conduit, wherein the oxidizing gas does not flow into the process chamber;

generating a plasma in the exhaust conduit from the oxidizing gas, the exhausted photoresist material, and the volatile byproducts;

measuring an emission signal intensity in the exhaust conduit correlating to a wavelength selected from the group consisting of about 283 nm, 309 nm, about 387 nm, about 431 nm, about 434 nm, about 468 nm, about 472 nm, about 513 nm, about 516 nm, about 656 nm, about 668 nm, about 777 nm, about 845 nm, and a combination of at least one of the foregoing wavelengths; and determining the endpoint of the oxygen free and nitrogen free plasma ashing process in response to an observed change in the emission signal within the exhaust conduit.

13. A method for determining an endpoint of an oxygen free and nitrogen free plasma ashing process used for stripping photoresist material and/or residues from a substrate having a carbon-containing low k dielectric material, comprising:

generating a remote first plasma in a process chamber in the absence of oxygen and nitrogen from a gas mixture comprising hydrogen or helium or a combination comprising at least one of the foregoing gases;

exposing the substrate provided in the process chamber to the first plasma to selectively remove photoresist material and/or residues from the substrate;

exhausting the removed photoresist material and/or residues from the process chamber into a single exhaust conduit having a substantially straight shape extending from the outlet;

generating a second plasma in the exhaust conduit to generate emissive species; and optically monitoring the emissive species within the exhaust conduit, wherein an endpoint of the first plasma is detected when an intensity of the emissive species within the second plasma changes to an amount greater or less than a predetermined threshold.

14. The method of claim 13, wherein generating the second plasma comprises introducing an oxidizing gas into the exhaust conduit, wherein the oxidizing gas does not flow into the process chamber.

15. The method of claim 13, wherein the second plasma is free of an oxidizing gas.

16. The method of claim 13, wherein optically monitoring the emissive species comprises monitoring wavelengths of the emissive species correlating to reactant species present in the process chamber.

17. The method of claim 13, wherein optically monitoring the emissive species comprises monitoring wavelengths of the emissive species optically monitoring species produced by a reaction between the second plasma and the removed photoresist material and/or residues.

* * * * *